US012723194B2

(12) United States Patent
Jung et al.

(10) Patent No.: US 12,723,194 B2
(45) Date of Patent: Sep. 1, 2026

(54) QUANTUM DOT COMPOSITION, LIGHT EMITTING ELEMENT AND DISPLAY DEVICE INCLUDING THE SAME

(71) Applicant: SAMSUNG DISPLAY CO., LTD., Yongin-si (KR)

(72) Inventors: Yunku Jung, Cheonan-si (KR); Minki Nam, Incheon (KR); Hyunmi Doh, Seoul (KR); Yunhyuk Ko, Anyang-si (KR); Sungwoon Kim, Yongin-si (KR); Jaehoon Kim, Seoul (KR); Myoungjin Park, Hwaseong-si (KR); Jae Hong Park, Seoul (KR); Junwoo Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/535,417

(22) Filed: Dec. 11, 2023

(65) Prior Publication Data

US 2024/0164130 A1 May 16, 2024

Related U.S. Application Data

(62) Division of application No. 16/895,590, filed on Jun. 8, 2020, now Pat. No. 11,895,856.

(30) Foreign Application Priority Data

Sep. 10, 2019 (KR) ........................ 10-2019-0112211

(51) Int. Cl.

*C09K 11/02* (2006.01)
*C09K 11/06* (2006.01)

(Continued)

(52) U.S. Cl.

CPC ............ *C09K 11/06* (2013.01); *H10K 50/115* (2023.02); *H10K 50/12* (2023.02); *H10K 59/38* (2023.02);

(Continued)

(58) Field of Classification Search

CPC ....... C09K 11/02; C09K 11/025; C09K 11/08; C09K 11/06; C09K 11/565; C09K 11/54;

(Continued)

(56) References Cited

U.S. PATENT DOCUMENTS 7,476,487 B2 1/2009 Park et al.
7,746,423 B2 6/2010 Im et al.

(Continued)

FOREIGN PATENT DOCUMENTS

CN 103113882 A 5/2013
CN 105185918 A 12/2015

(Continued)

OTHER PUBLICATIONS

Jung, Yun Ku et al.; "Thermal Decomposition Mechanism of Single-Molecule Precursors Forming Metal Sulfide Nanoparticles"; Department of Chemistry, Seoul National University, Seoul 151-747, South Korea; JACS; Dec. 14, 2009; pp. S1-S4.

(Continued)

*Primary Examiner* — Matthew E. Hoban
*Assistant Examiner* — Lynne Edmondson
(74) *Attorney, Agent, or Firm* — Womble Bond Dickinson (US) LLP

(57) ABSTRACT

A quantum dot composition includes a quantum dot, a ligand to bind to a surface of the quantum dot, an additive having an amine group, and a precursor comprising an organometallic compound, the composition forming a modified quantum dot having a reformed surface characteristic. A light emitting element including the modified quantum dot may (Continued)

have improved lifespan, luminous efficiency, and material stability.

4 Claims, 14 Drawing Sheets

(51) Int. Cl.

| | |
|---|---|
| ***C09K 11/08*** | (2006.01) |
| ***C09K 11/56*** | (2006.01) |
| ***H10K 50/115*** | (2023.01) |
| ***H10K 50/12*** | (2023.01) |
| ***H10K 59/38*** | (2023.01) |
| ***H10K 85/30*** | (2023.01) |
| ***H10K 85/60*** | (2023.01) |
| *H10K 59/80* | (2023.01) |
| *H10K 102/00* | (2023.01) |
| *H10K 102/10* | (2023.01) |

(52) U.S. Cl.
CPC ........... *H10K 85/30* (2023.02); *H10K 85/631* (2023.02); *C09K 2211/18* (2013.01); *H10K 59/873* (2023.02); *H10K 59/8792* (2023.02); *H10K 2102/103* (2023.02); *H10K 2102/351* (2023.02)

(58) Field of Classification Search
CPC ... C09K 11/56; C09K 2211/18; H01L 51/502; H10K 50/115; H10K 50/14; H10K 50/15; H10K 50/16; H10K 59/32
See application file for complete search history.

(56) References Cited

U.S. PATENT DOCUMENTS 8,120,010 B2 2/2012 Cho et al.
8,895,319 B2 11/2014 Koo et al.
9,196,682 B2 11/2015 Jang et al.
9,212,056 B2 12/2015 Breen et al.
9,223,234 B2 12/2015 Parsapour et al.
9,517,936 B2 12/2016 Jeong et al.
10,196,562 B2 2/2019 Werner et al.
10,246,634 B2 4/2019 Yang et al.
10,676,666 B2 6/2020 Kwon et al.
10,950,427 B2 3/2021 Kim et al.
10,961,446 B2 3/2021 Kim et al.
10,988,685 B2 4/2021 Ahn et al.
11,050,033 B2 6/2021 Kim et al.
11,149,199 B2 10/2021 Lee et al.
11,152,584 B2 10/2021 Angioni
11,186,767 B2 11/2021 Ahn et al.
11,214,733 B2 1/2022 Park et al.
11,421,151 B2 * 8/2022 Cho .................... C09K 11/703
11,825,672 B2 11/2023 Zampetti et al.
11,910,703 B2 * 2/2024 Lee ....................... C09K 11/06
12,082,430 B2 9/2024 Imabayashi et al.
12,484,374 B2 11/2025 Iwasaki et al.
2006/0216759 A1 9/2006 Naasani
2007/0202333 A1 8/2007 O'Brien et al.
2008/0160306 A1 7/2008 Mushtaq et al.
2008/0213919 A1 9/2008 Naasani
2011/0017951 A1 1/2011 Ryowa
2011/0070147 A1 3/2011 O'Brien et al.
2011/0084250 A1 4/2011 Jang et al.
2012/0174969 A1 7/2012 Murayama
2012/0270231 A1 * 10/2012 Smith .................. C09K 11/584 435/7.1
2013/0099213 A1 4/2013 Jun et al.
2014/0151612 A1 6/2014 Cho et al.
2014/0353579 A1 12/2014 Greco et al.
2014/0369024 A1 12/2014 Xu et al.
2015/0021551 A1 1/2015 Breen et al.
2015/0098212 A1 4/2015 Won et al.
2015/0200035 A1 7/2015 Lee et al.
2016/0005932 A1 1/2016 Lee et al.
2016/0011506 A1 1/2016 Gu et al.
2017/0012180 A1 1/2017 Baesjou et al.
2017/0082892 A1 3/2017 Chung
2017/0176816 A1 6/2017 Han et al.
2017/0183567 A1 6/2017 Zhou et al.
2017/0247613 A1 8/2017 Ono
2017/0342316 A1 11/2017 Luther et al.
2018/0033984 A1 2/2018 Luchinger et al.
2018/0054872 A1 2/2018 Xu et al.
2018/0148638 A1 5/2018 Ahn et al.
2018/0151817 A1 * 5/2018 Cho .................... C09K 11/883
2018/0179441 A1 6/2018 Park et al.
2018/0354244 A1 12/2018 Jen-La Plante et al.
2019/0081263 A1 3/2019 Park et al.
2019/0198796 A1 6/2019 Kim et al.
2019/0276734 A1 9/2019 Kim et al.
2020/0025772 A1 1/2020 Smith et al.
2020/0067005 A1 2/2020 Park et al.
2020/0239781 A1 7/2020 Hirst et al.
2020/0395561 A1 12/2020 Park et al.
2021/0074939 A1 3/2021 Jung et al.
2021/0091324 A1 3/2021 Jung et al.
2021/0091327 A1 3/2021 Kim et al.
2021/0222064 A1 7/2021 Zhang
2021/0273189 A1 9/2021 Imabayashi et al.
2021/0371737 A1 12/2021 Jung et al.
2022/0002619 A1 1/2022 Luther et al.
2022/0310960 A1 9/2022 Honda et al.
2023/0232646 A1 7/2023 Takenaka et al.
2023/0337449 A1 10/2023 Yoshikawa et al.
2023/0413589 A1 12/2023 Naka et al.
2024/0067872 A1 2/2024 Wang
2024/0155858 A1 5/2024 Handa
2024/0172551 A1 5/2024 Jang et al.
2024/0237508 A1 7/2024 Feng et al.
2024/0352312 A1 10/2024 Wang
2024/0373660 A1 11/2024 Ueta
2024/0424464 A1 12/2024 Gong et al.
2025/0056958 A1 2/2025 Jung et al.
2025/0145883 A1 5/2025 Mei
2025/0215316 A1 7/2025 Ge

FOREIGN PATENT DOCUMENTS

CN 105985774 A 10/2016
CN 107722184 A 2/2018
CN 108110144 A 6/2018
EP 3070756 A1 9/2016
EP 3187564 A1 7/2017
EP 3327813 A1 5/2018
JP 2014-93327 A 5/2014
KR 10-2011-0106637 A 9/2011
KR 10-20120-028670 A 3/2012
KR 10-2012-0050145 A 5/2012
KR 10-1212656 B1 12/2012
KR 20130031157 A 3/2013
KR 10-2013-0044071 A 5/2013
KR 10-2013-0114436 A 10/2013
KR 10-2015-0072089 A 6/2015
KR 10-1557498 B1 10/2015
KR 10-2017-0034055 A 3/2017
KR 10-2017-0048220 A 5/2017
KR 10-1740429 B1 5/2017
KR 10-2017-0072418 A 6/2017
KR 10-2017-0125364 A 11/2017
KR 10-2018-0059363 A 6/2018
KR 10-2018-0060440 A 6/2018
KR 20180059724 A 6/2018
KR 10-2018-0077086 A 7/2018
KR 10-2019-0004536 A 1/2019
KR 10-2019-0106819 A 9/2019
KR 10-2019-0141622 A 12/2019
WO 00/17656 A1 3/2000

(56) References Cited

FOREIGN PATENT DOCUMENTS

| | | |
|---|---|---|
| WO | 2015/002565 A1 | 1/2015 |
| WO | 2016/080435 A1 | 5/2016 |

OTHER PUBLICATIONS

Kirkwood, Nicolas et al.; "Finding and Fixing Traps in II-VI and III-V Colloidal Quantum Dots: The Importance of Z-Type Ligand Passivation"; Journal of the American Chemical Society; Oct. 30, 2018; pp. 15712-15723.

Aldeek, Fadi et al., "Enhanced Photostability from CdSe(S)/ZnO Core/Shell Quantum Dots and Their Use in Biolabeling", Eur. J. Inorg. Chem. 2011, 794-801 (8 pages).

Ouyang, Jianying et al., "Gradiently Alloyed ZnxCd1-xS Colloidal Photoluminescent Quantum Dots Synthesized via a Noninjection One-Pot Approach", J. Phys. Chem. C 2008, 112, 4908-4919 (12 pages).

Boles, Michael A., et al., "The surface science of nanocrystals", Nature Materials, Feb. 2016, pp. 141-364, vol. 15, Macmillan Publishers Limited.

Extended European Search Report dated Mar. 2, 2018, of the corresponding European Patent Application No. 17203145.2.

Extended European Search Report dated Mar. 5, 2018, of the corresponding European Patent Application No. 17203152.8.

US Office Action dated Nov. 20, 2018, issued in U.S. Appl. No. 15/820,781 (12 pages).

US Final Office Action dated Mar. 8, 2019, issued in U.S. Appl. No. 15/820,781 (9 pages).

US Office Action dated Jan. 22, 2020, issued in U.S. Appl. No. 15/821,007 (14 pages).

US Final Office Action dated Jun. 25, 2020, issued in U.S. Appl. No. 15/821,007 (15 pages).

US Office Action dated Jun. 23, 2021, issued in U.S. Appl. No. 15/821,007 (13 pages).

US Office Action dated Dec. 21, 2021, issued in U.S. Appl. No. 15/821,007 (12 pages).

US Notice of Allowance dated Apr. 18, 2022, issued in U.S. Appl. No. 15/821,007 (7 pages).

US Office Action dated Jun. 12, 2025, issued in U.S. Appl. No. 17/889,236 (28 pages).

US Final Office Action dated Sep. 17, 2025, issued in U.S. Appl. No. 17/889,236 (9 pages).

US Final Office Action dated Dec. 16, 2025, issued in U.S. Appl. No. 17/889,236 (15 pages).

* cited by examiner

DD
DP
PP
DP-EL
CFL
BL
CF
BM
BFL
TFE
OH
PDL
DP-CL
BS
NPXA
PXA-R
PXA-G
PXA-B
CF-R
CF-G
CF-B
II
II'
EL1 HTR EL-R MQD3 ETR EL2
ED-3
EL1 HTR EL-G MQD2 ETR EL2
ED-2
EL1 HTR EL-B MQD1 ETR EL2
ED-1

QUANTUM DOT COMPOSITION, LIGHT EMITTING ELEMENT AND DISPLAY DEVICE INCLUDING THE SAME

CROSS-REFERENCE TO RELATED APPLICATION

This application is a divisional of U.S. patent application Ser. No. 16/895,590, filed Jun. 8, 2020, which claims priority to and the benefit of Korean Patent Application No. 10-2019-0112211, filed on Sep. 10, 2019, the entire content of all of which are incorporated herein by reference.

BACKGROUND

1. Field

One or more aspects of embodiments of the present disclosure herein relate to a quantum dot composition, a light emitting element including a light emission layer formed from (utilizing) the quantum dot composition, and a display device including the same.

2. Description of the Related Art

Various display devices used in multimedia devices such as televisions, cellular phones, tablet computers, navigations and/or game consoles are being developed. In such display devices, a self-luminescent display element capable of accomplishing display of images by causing an organic compound-containing light emitting material to emit light may be used.

In order to improve color reproducibility of a display device, development of a light emitting element using a quantum dot as a light emitting material is being conducted, and there is a demand (desire) for improving luminous efficiency and lifespan of a light emitting element using a quantum dot.

SUMMARY

One or more embodiments of the present disclosure are directed toward a quantum dot composition capable of exhibiting improved lifespan and luminous efficiency characteristics when being used for a light emission layer of a light emitting element.

Embodiments of the present disclosure provide a light emitting element having improved luminous efficiency and including, in a light emission layer, a quantum dot containing a metal compound attached to the surface thereof.

Embodiments of the present disclosure also provide a display device having improved luminous efficiency and including a light emitting element having, in a light emission layer, a quantum dot containing a metal compound attached to the surface thereof.

Embodiments of the present disclosure provide a quantum dot composition including a quantum dot, an additive having an amine group, and a precursor having an organometallic compound, wherein the organometallic compound includes oxygen and/or sulfur.

In an embodiment, a quantum dot composition may include a ligand to bind to a surface of the quantum dot.

In an embodiment, the precursor may include at least one selected from M-O(O)—C—$R_1$, M-S(S)—C—$R_1$, M-O(O)—C—NH—$R_1$, M-S(S)—C—NH—$R_1$, M-O(O)—C—N—$R_1$, M-S(S)—C—N—$R_1$, M-O(O)—C—O—$R_1$, M-S(S)—C—O—$R_1$, M-O(O)—[C(O)O—C(O)O]n, and M-S(S)—[C(O)O—C(O)O]n, and in the precursor, $R_1$ may be an alkyl group having 1 to 20 carbon atoms, n may be an integer of 1 to 10, and M may include at least one selected from Cd, Zn, Ir, Ga, Pd, Cu, Ag, Au, Rh, Ir, Ru, and Os.

In an embodiment, the additive may include a primary amine or a secondary amine.

In an embodiment, the precursor and the additive may react according to a reaction mechanism represented by Reaction Formula 1 below:

Reaction Formula 1

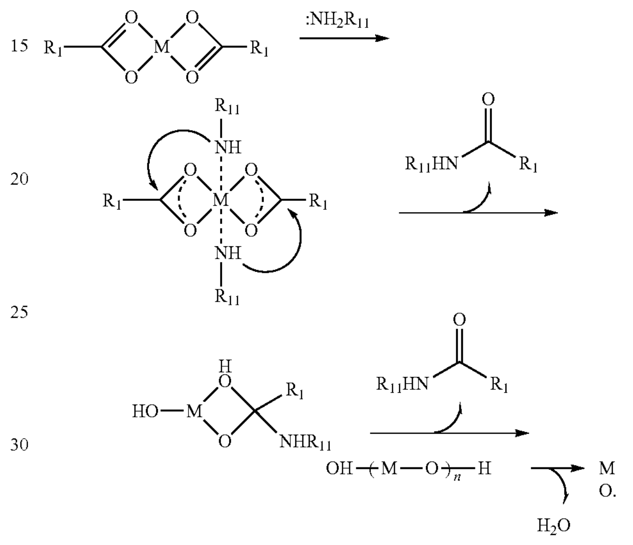

$R_1$ and $R_{11}$ in Reaction Formula 1 may each independently be an alkyl group having 1 to 20 carbon atoms, and M may include at least one selected from Cd, Zn, Ir, Ga, Pd, Cu, Ag, Au, Rh, Ir, Ru, and Os.

In an embodiment, the quantum dot composition may further include an organic solvent.

In an embodiment, the molar ratio of the precursor to the additive may be 1:2.

In an embodiment, the quantum dot may include a core and a shell surrounding the core.

In other embodiments of the present disclosure, a light emitting element includes a first electrode, a hole transport region on the first electrode, a light emission layer on the hole transport region and including a modified quantum dot including a metal compound having oxygen and/or sulfur, an electron transport region on the light emission layer, and a second electrode on the electron transport region.

In an embodiment, the modified quantum dot may include a quantum dot having a core and a shell surrounding the core, a ligand to bind to a surface of the quantum dot, and a metal compound to bind to the surface of the quantum dot.

In an embodiment, the shell may include a cation binding portion and an anion binding portion, the ligand may bind to the cation binding portion, and the metal compound may bind to the anion binding portion.

In an embodiment, the metal compound may include a metal oxide or a metal sulfide.

In an embodiment, the light emission layer may be formed from a quantum dot composition including a quantum dot, a ligand to bind to a surface of the quantum dot, an additive including an amine group, and a precursor including an organometallic compound, wherein the precursor includes at least one selected from M-O(O)—C—R, M-S(S)—C—R, M—O(O)—C—NH—R, M-S(S)—C—NH—R, M-O(O)—C—N—R, M-S(S)—C—N—R, M-O(O)—C—O—R, M-S(S)—C—O—R, M-O(O)—[C(O)O—C(O)O]n, and M-S(S)—[C(O)O—C(O)O]n, and in the precursor, R may be an alkyl group having 1 to 20 carbon atoms, n may be an integer of 1 to 10, and M may include at least one selected from Cd, Zn, Ir, Ga, Pd, Cu, Ag, Au, Rh, Ir, Ru, and Os, and the additive may be a primary or a secondary amine.

In still other embodiments of the present disclosure, a display device includes a plurality of light emitting elements, wherein each of the plurality of light emitting elements includes a first electrode, a second electrode facing the first electrode, and a light emission layer between the first electrode and the second electrode and including a modified quantum dot, and the modified quantum dot includes a metal compound having oxygen and/or sulfur.

In an embodiment, the plurality of light emitting elements may include a first light emitting element including a first modified quantum dot to emit a first color light, a second light emitting element including a second modified quantum dot to emit a second color having a longer wavelength than the first color light, and a third light emitting element including a third modified quantum dot to emit a third color light having a longer wavelength than each of the first and second color light.

In an embodiment, each of the first to third modified quantum dots may include a quantum dot having a core and a shell surrounding the core, a ligand to bind to a surface of the quantum dot, and the metal compound to bind to a surface of the quantum dot.

In an embodiment, a color filter layer on the light emitting elements may be further included, wherein the color filter layer may include a first filter to transmit the first color light, a second filter to transmit the second color light, and a third filter to transmit the third color light.

In an embodiment, the metal compound may include a metal oxide or a metal sulfide.

In an embodiment, the metal compound may include at least one selected from Cd, Zn, Ir, Ga, Pd, Cu, Ag, Au, Rh, Ir, Ru, and Os.

DETAILED DESCRIPTION

Figure 1:
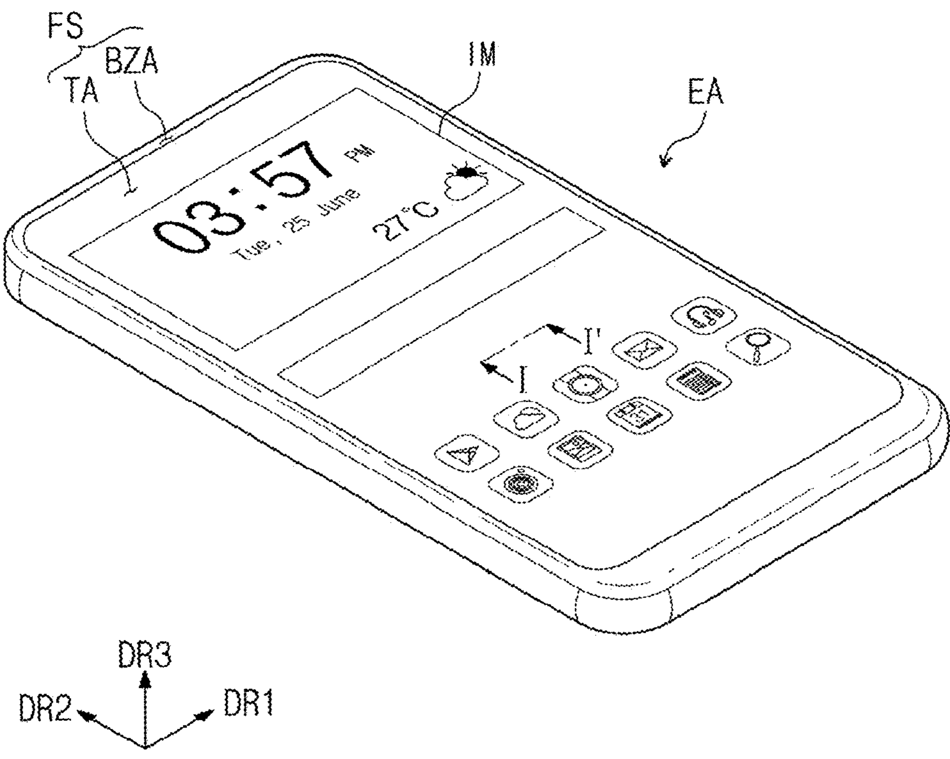
FIG. 1 is a perspective view of a display device according to an embodiment of the present disclosure.

The present disclosure may be modified in many alternate forms, and thus specific embodiments will be exemplified in the drawings and described in more detail below. It should be understood, however, that it is not intended to limit the present disclosure to the particular forms disclosed, but rather, is intended to cover all modifications, equivalents, and alternatives falling within the spirit and scope of the invention.

In the present disclosure, when an element (or a region, a layer, a portion, etc.) is referred to as being "on," "connected to," or "coupled to" another element, it means that the element may be directly on/connected to/coupled to the other element, or that a third intervening element may be positioned therebetween.

In the present specification, when an element (or a region, a layer, a portion, etc.) is referred to as being "directly on," "directly connected to," or "directly coupled to" another element, it means that there is no layer, film, region, plate and/or the like added therebetween. For example, "directly on," "directly connected to," or "directly coupled to" may refer to placing no additional members (such as an adhesive member) between two layers or two members.

Like reference numerals refer to like elements. Also, in the drawings, the thickness, the ratio, and the dimensions of elements are exaggerated for an effective description of technical contents.

The term "and/or," includes all combinations of one or more of which associated configurations may define. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. These terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a quantum dot composition, a light emitting element, and a display device including the same according to an embodiment of the present disclosure will be described with reference to the accompanying drawings.

Figure 2:
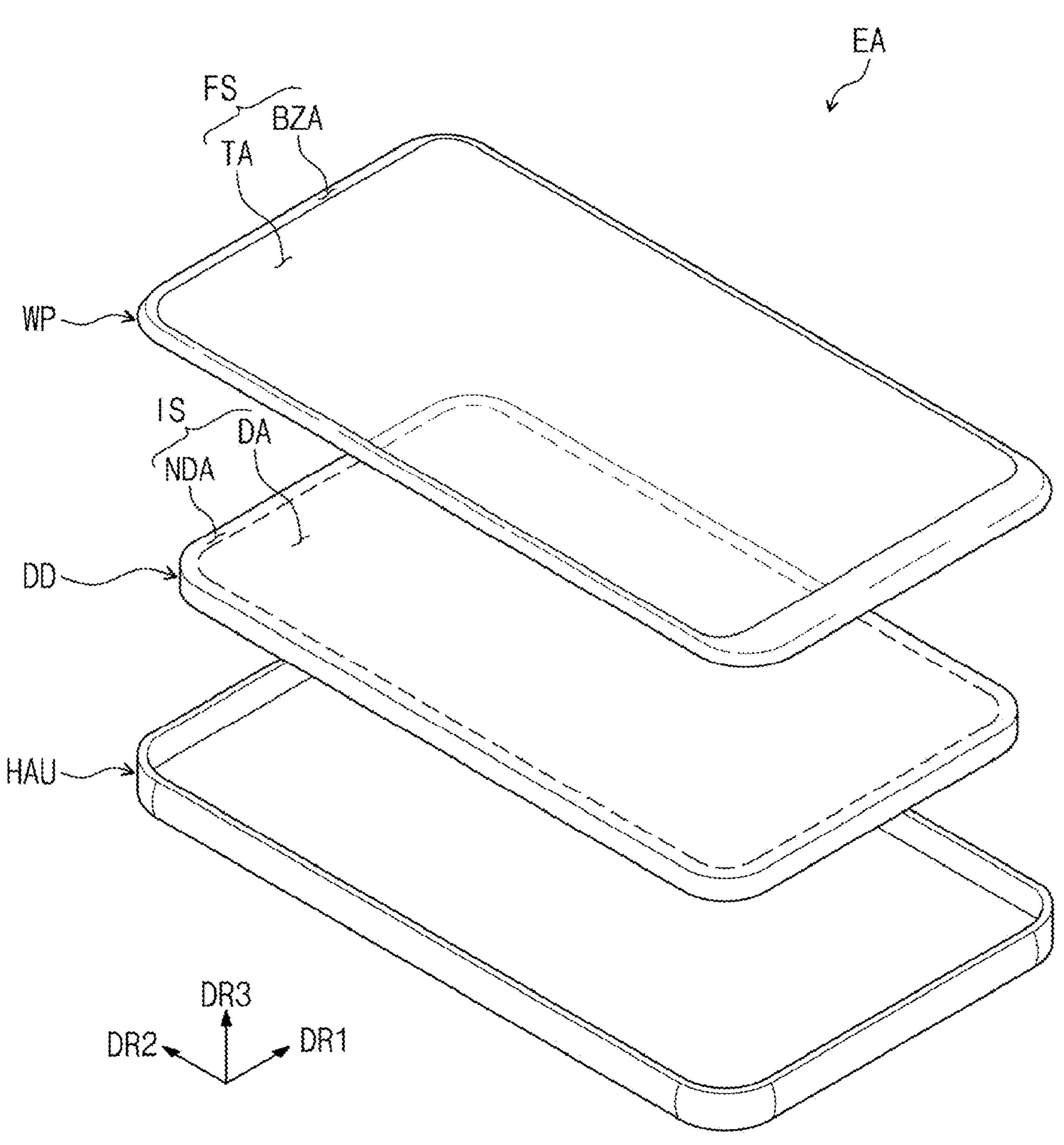
FIG. 2 is an exploded perspective view of a display device according to an embodiment of the present disclosure.
Figure 3:
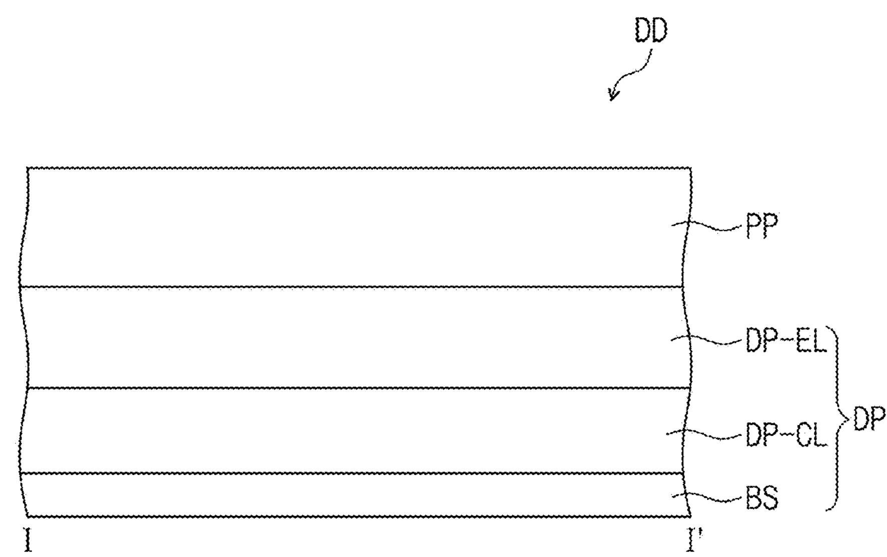
FIG. 3 is a cross-sectional view of a display device according to an embodiment of the present disclosure taken along line I-I' of FIG. 1.
Figure 4:
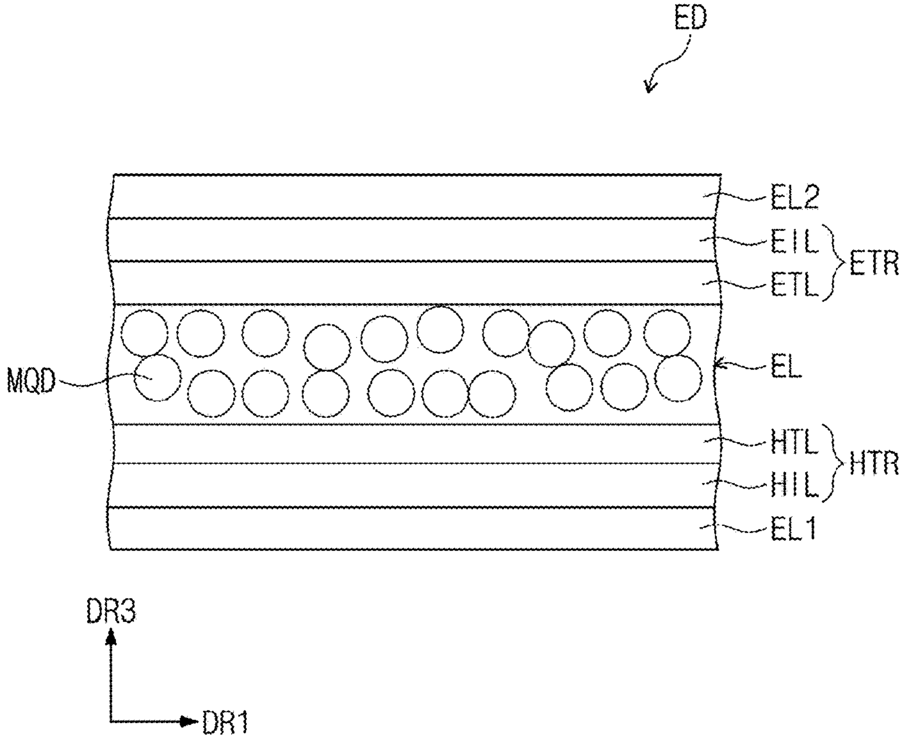
FIG. 4 is a cross-sectional view of a light emitting element according to an embodiment of the present disclosure.
Figure 5:
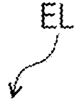
FIG. 5 is a cross-sectional view schematically illustrating a light emission layer according to an embodiment of the present disclosure.
Figure 5:
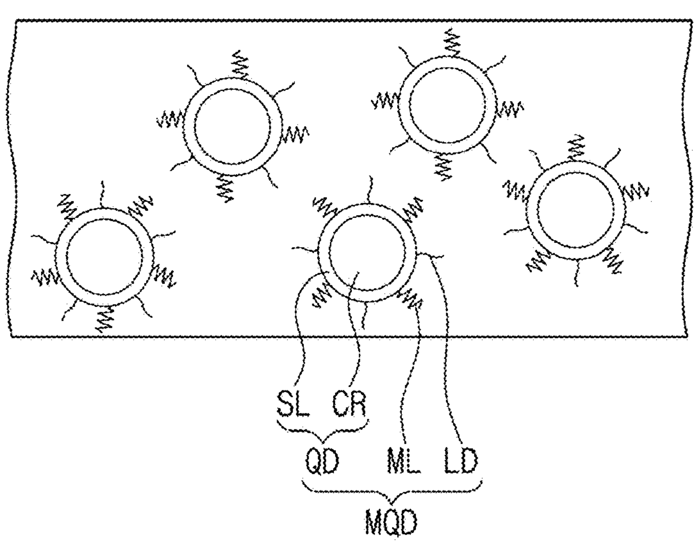
Figure 6:
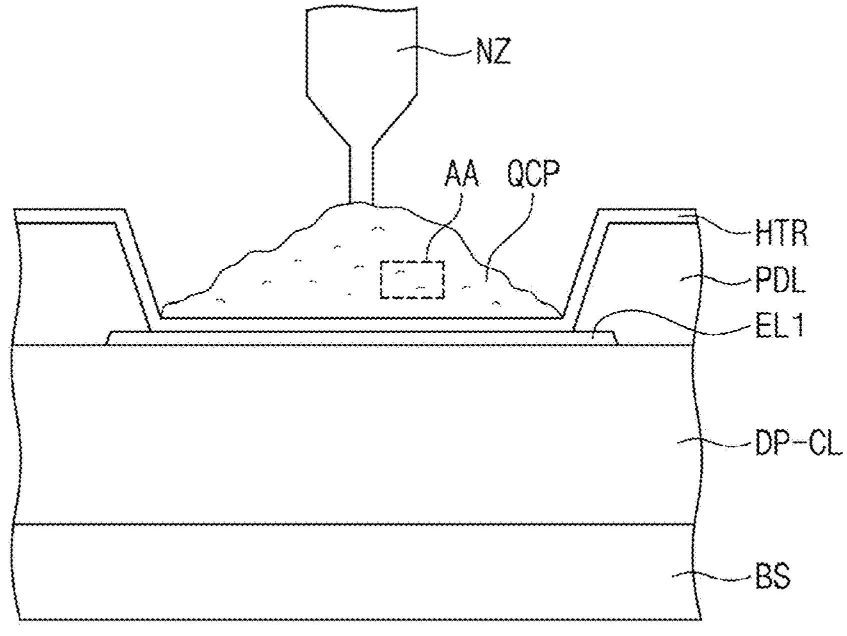
FIG. 6 is a schematic view illustrating a part (act) of a manufacturing method of a light emitting element according to an embodiment of the present disclosure.
Figure 7:
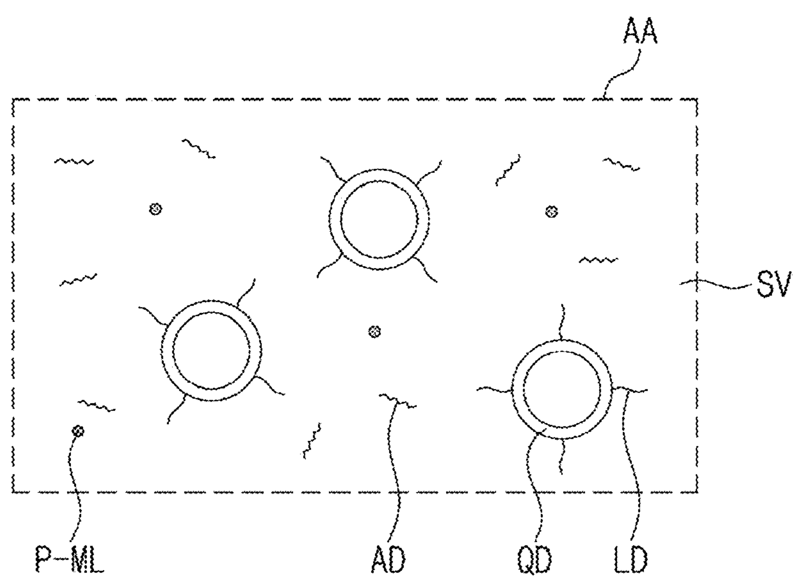
FIG. 7 is a schematic view illustrating a portion of a quantum dot composition according to an embodiment of the present disclosure.
Figure 8:
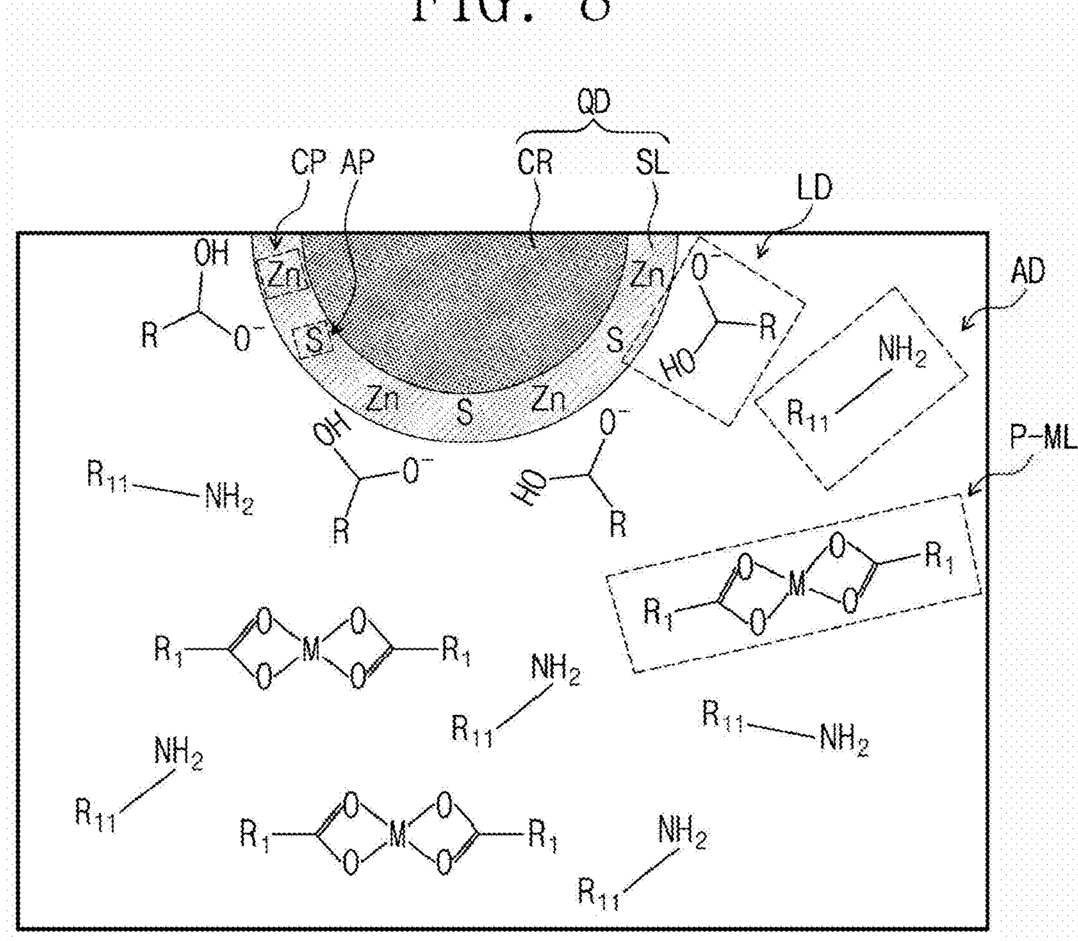
FIG. 8 is a schematic view illustrating a quantum dot composition according to an embodiment of the present disclosure.
Figure 9:
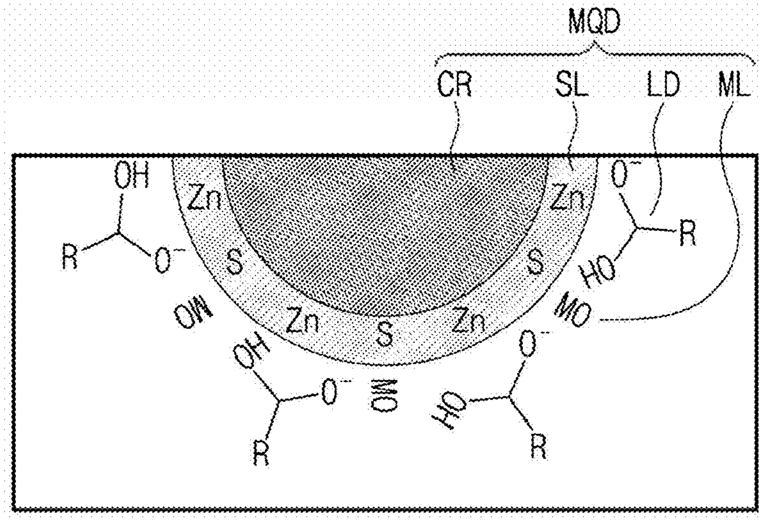
FIG. 9 is a schematic view illustrating a portion of a modified quantum dot according to an embodiment of the present disclosure.

FIG. 1 is a perspective view of an electronic device EA according to an embodiment. FIG. 2 is an exploded perspective view of an electronic device EA according to an embodiment. FIG. 3 is a cross-sectional view of a display device DD according to an embodiment. FIG. 4 is a cross-sectional view of a light emitting element ED according to an embodiment. FIG. 5 is a cross-sectional view schematically illustrating a light emission layer EL according to an embodiment. FIG. 6 is a schematic view illustrating a part (an act) of a manufacturing method of a light emitting element ED according to an embodiment. FIG. 7 illustrates a portion ("AA" region) of a quantum dot composition QCP provided in FIG. 6 in more detail. FIG. 8 is a schematic view of the quantum dot composition QCP according to an embodiment. FIG. 9 is a schematic view illustrating a portion of a modified quantum dot MQD according to an embodiment.

In an embodiment, an electronic device EA may be a large-sized electronic device such as a television, a monitor, and/or an outdoor billboard. In some embodiments, the electronic device EA may be a small- or a medium-sized electronic device such as a personal computer, a notebook computer, a personal digital terminal, a car navigation unit, a game console, a smart phone, a tablet, and/or a camera. However, these are presented as examples, and other suitable electronic devices may thus be employed. In this embodiment, the electronic device EA is exemplarily shown as a smart phone.

The electronic device EA may include a display device DD and a housing HAU. The display device DD may display an image IM through a display surface IS. FIG. 1 shows that the display surface IS is in parallel to a surface defined by a first direction DR1 and a second direction DR2, crossing the first direction DR1. However, this is an illustration, and in another embodiment, the display surface IS of the display device DD may have a curved shape.

Among the lines normal to the display surface IS, that is, the thickness direction of the display device DD, a direction in which the image IM is displayed is indicated by a third direction DR3. The front surface (or top surface) and rear surface (or bottom surface) of each member may be divided by the third direction DR3 (may be defined with respect to the third direction DR3).

A fourth direction DR4 (FIG. 15) may be a direction between the first direction DR1 and the second direction DR2. The fourth direction DR4 may be positioned on a surface parallel to the surface defined by the first direction DR1 and the second direction DR2. However, the directions indicated by the first to fourth directions DR1, DR2, DR3 and DR4 are a relative concept and may be changed to other directions.

The display surface IS on which the image IM is displayed in the electronic device EA may correspond to a front surface of the display device DD and may correspond to a front surface FS of a window WP. Hereinafter, the same reference numerals will be used for the display surface and the front surface of the electronic device EA, and the front surface of the window WP. The image IM may include a dynamic image as well as a still image. In some embodiments, the electronic device EA may include a foldable display device having a folding area and a non-folding area, or a bending display device having at least one bent part.

The housing HAU may hold the display device DD. The housing HAU may cover the display device DD so that the top surface of the display surface IS of the display device DD is exposed. The housing HAU may cover a side surface and the bottom surface of the display device DD and may expose the entire top surface. However, an embodiment of the present disclosure is not limited thereto, and the housing HAU may cover a portion of the top surface, as well as the side surface and the bottom surface of the display device DD.

In the electronic device EA of an embodiment, the window WP may include an optically transparent insulating material. The window WP may include a transmission area TA and a bezel area BZA. The front surface FS of the window WP, including the transmissive area TA and the bezel area BZA, corresponds to the front surface FS of the electronic device EA. A user may visually recognize an image provided through the transmission area TA corresponding to the front surface FS of the electronic device EA.

In FIGS. 1 and 2, the transmission area TA is shown in a rectangular shape with rounded vertices (edges). However, this is only illustrative, and the transmission area TA may have various suitable shapes and is not limited to any one embodiment.

The transmission area TA may be an optically transparent area. The bezel area BZA may be an area having a relatively low light transmittance compared to the transmission area TA. The bezel area BZA may have a predetermined (or set) color. The bezel area BZA may be adjacent to the transmission area TA and may surround the transmission area TA. The bezel area BZA may define the shape of the transmission area TA. However, the embodiment is not limited to the illustrated example, and the bezel area BZA may be adjacent to only one side of the transmission area TA, and a part thereof may be omitted.

The display device DD may be under the window WP. In the present specification, "below" may mean a direction opposite to a direction in which the display device DD provides an image.

In an embodiment, the display device DD may be substantially configured to generate the image IM. The image IM generated in the display device DD is displayed on the display surface IS and is visually recognized by a user through the transmission area TA from outside. The display device DD includes a display area DA and a non-display area NDA. The display area DA may be an area activated according to an electrical signal. The non-display area NDA may be an area covered by the bezel area BZA. The non-display area NDA is adjacent to the display area DA. The non-display area NDA may surround the display area DA.

The display device DD may include a display panel DP and a light controlling layer PP disposed on the display panel DP (see FIG. 3). The display panel DP may include a display element layer DP-EL. The display element layer DP-EL includes a light emitting element ED.

The display device DD may include a plurality of light emitting elements. The light controlling layer PP may be on the display panel DP to control external light reflected light from the display panel DP. The light controlling layer PP may include, for example, a polarization layer and/or a color filter layer.

In the display device DD of an embodiment, the display panel DP may be a light emitting display panel. For example, the display panel DP may be a quantum dot light emitting display panel including a quantum dot light emitting element. However, the embodiment is not limited thereto.

The display panel DP may include a base substrate BS, a circuit layer DP-CL on the base substrate BS, and the display element layer DP-EL on the circuit layer DP-CL.

The base substrate BS may be a member that provides a base surface on which the display element layer DP-EL is positioned. The base substrate BS may be a glass substrate, a metal substrate, a plastic substrate, etc. However, an embodiment of the present disclosure is not limited thereto, and the base substrate BS may be an inorganic layer, an organic layer or a composite material layer. The base substrate BS may be a flexible substrate that can be easily bent and/or folded.

In an embodiment, the circuit layer DP-CL may be on the base substrate BS, and the circuit layer DP-CL may include a plurality of transistors. The transistors may each include a control electrode, an input electrode, and an output electrode. For example, the circuit layer DP-CL may include a switching transistor and a driving transistor for driving the light emitting element ED of the display element layer DP-EL.

Referring to FIG. 4, the light emitting element ED according to an embodiment includes a first electrode EL1, a second electrode EL2 facing the first electrode EL1, and a plurality of functional layers between the first electrode EL1 and the second electrode EL2 and including the light emission layer EL.

The plurality of functional layers includes a hole transport region HTR between the first electrode EL1 and the light emission layer EL, and an electron transport region ETR between the light emission layer EL and the second electrode EL2. A capping layer may be further positioned on the second electrode EL2 in an embodiment.

The hole transport region HTR and the electron transport region ETR may each include a plurality of sub functional layers. For example, the hole transport region HTR may include a hole injection layer HIL and a hole transport layer HTL as sub functional layers, and the electron transport region ETR may include an electron injection layer EIL and an electron transport layer ETL as sub functional layers. However, an embodiment of the present disclosure is not limited thereto, and the hole transport region HTR may further include an electron blocking layer as a sub functional layer, and the electron transport region ETR may further include a hole blocking layer as a sub functional layer.

In the light emitting element ED according to an embodiment, the first electrode EL1 has conductivity. The first electrode EL1 may be formed of a metal alloy or any suitable conductive compound. The first electrode EL1 may be an anode. The first electrode EL1 may be a pixel electrode.

In the light emitting element ED according to an embodiment, the first electrode EL1 may be a reflective electrode. However, an embodiment of the present disclosure is not limited thereto. For example, the first electrode EL1 may be a transmissive electrode, or a semi-transparent electrode. If the first electrode EL1 is the semi-transparent electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a multilayered structure including a reflective layer or a semi-transparent layer formed of any of the above-described materials, and a transparent conductive layer formed of indium tin oxide (ITO), indium zinc oxide (IZO), zinc oxide (ZnO), indium tin zinc oxide (ITZO), etc. For example, the first electrode EL1 may be a multilayered metal layer, and may have a laminated structure of ITO/Ag/ITO.

The hole transport region HTR may be positioned on the first electrode EL1. The hole transport region HTR may include a hole injection layer HIL and a hole transport layer HTL. In addition, the hole transport region HTR may further include at least one selected from a hole buffer layer and an electron blocking layer, in addition to the hole injection layer HIL and the hole transport layer HTL. The hole buffer layer may compensate an optical resonance distance according to the wavelength of light emitted from the light emission layer EL and may increase light emission efficiency. Materials which may be included in the hole transport region HTR may be used as materials included in the hole buffer layer. The electron blocking layer is a layer playing the role of blocking or reducing the electron injection from the electron transport region ETR to the hole transport region HTR.

The hole transport region HTR may have a single layer formed of a single material, a single layer formed of a plurality of different materials, or a multilayer structure including a plurality of layers formed of a plurality of different materials. For example, the hole transport region HTR may have a structure of a single layer formed of a plurality of different materials or a structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, which are laminated in order from the first electrode EL1, but the embodiment is not limited thereto.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include carbazole derivatives (such as N-phenyl carbazole and/or polyvinyl carbazole), fluorine derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl) triphenylamine (TCTA)), N—N'-di(naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis (N-carbazolyl)benzene (mCP), etc.

The light emission layer EL may be provided on the hole transport region HTR. Referring to FIG. 5, the light emission layer EL of the light emitting element ED according to an embodiment may include a modified quantum dot MQD.

The modified quantum dot MQD may include a core CR, a shell SL surrounding the core CR, and a ligand LD and a metal compound ML which are attached to the surface of the shell SL. The ligand LD and the metal compound ML may be attached to a surface of a quantum dot QD. The ligand LD may include an organic and/or inorganic substance. For example, the ligand LD may be oleic acid, but is not limited thereto.

The metal compound ML may include sulfur and/or oxygen to bind (e.g., binding or bound) to the metal. In some embodiments, the metal compound ML may be a metal oxide or a metal sulfide. For example, the metal may be at least one selected from Cd, Zn, Ir, Ga, Pd, Cu, Ag, Au, Rh, Ir, Ru, and Os. For example, M may be Cd, Zn, Ir or Ga, but is not limited thereto.

In one embodiment, the light emission layer EL may include a plurality of modified quantum dots MQD. The modified quantum dots MQD included in the light emission layer EL may be stacked to form a layer. In FIG. 4, for example, the modified quantum dots MQD having a circular cross-section are arranged to form two layers, but the embodiment is not limited thereto. For example, the arrangement of the modified quantum dots MQD included in the light emission layer EL may vary according to the thickness of the light emission layer EL, the shape of the quantum dot QD, the average diameter of the quantum dots QD, and/or the types of the ligand LD and/or the metal compound ML that bind to the quantum dot QD. For example, the modified quantum dots MQD in the light emission layer EL may be aligned to be adjacent to each other to form one layer, or may be aligned to form a plurality of layers such as two or three layers.

The light emission layer EL may have, for example, a thickness of about 5 nm to about 20 nm, or about 10 nm to about 20 nm. As described above, the light emission layer EL may include a modified quantum dot MQD that is the quantum dot of the present embodiments. The modified quantum dot MQD may be a quantum dot obtained by modifying the surface of the quantum dot QD of the quantum dot composition.

The quantum dot may be a semiconductor nanocrystal that may be selected from among a compound of any of groups II-IV, a compound of any of groups III-V, a compound of any of groups IV-VI, an element in group IV, a compound of group IV, and combinations thereof.

The compound of any of groups II-VI may be selected from the group consisting of a binary compound (selected from the group consisting of CdSe, CdTe, ZnS, ZnSe, ZnTe, ZnO, HgS, HgSe, HgTe, MgSe, MgS, and mixtures thereof), a ternary compound (selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof), and a quaternary compound (selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof).

The compound of any of groups III-V may be selected from the group consisting of a binary compound (selected from the group consisting of GaN, GaP, GaAs, GaSb, AlN, AlP, AlAs, AlSb, InN, InP, InAs, InSb, and mixtures thereof), a ternary compound (selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and mixtures thereof), and a quaternary compound (selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof).

The compound of any of groups IV-VI may be selected from the group consisting of a binary compound (selected from the group consisting of SnS, SnSe, SnTe, PbS, PbSe, PbTe, and mixtures thereof), a ternary compound (selected from the group consisting of SnSeS, SnSeTe, SnSTe, PbSeS, PbSeTe, PbSTe, SnPbS, SnPbSe, SnPbTe, and mixtures thereof), and a quaternary compound (selected from the group consisting of SnPbSSe, SnPbSeTe, SnPbSTe, and mixtures thereof). The element in group IV may be selected from the group consisting of Si, Ge, and mixtures thereof. The compound of group IV may be a binary compound selected from the group consisting of SiC, SiGe, and mixtures thereof.

In some embodiments, the binary compound, the ternary compound and/or the quaternary compound may be present at uniform concentration in a particle, or may be present in the same particle in a state in which a concentration distribution is partially different. In addition, a core/shell structure in which one quantum dot surrounds another quantum dot may be possible. The interface between the core and the shell may have a concentration gradient in which the concentration of an element present in the shell is decreased toward a center.

In some embodiments, the quantum dot may have a core-shell structure including a core including a nanocrystal and a shell surrounding the core. The shell of the quantum dot having the core-shell structure may serve as a protection layer for preventing or reducing the chemical deformation of the core to maintain semiconductor properties and/or serve as a charging layer for imparting the quantum dot with electrophoretic properties. The shell may have a single layer or a multilayer. The interface between the core and the shell may have a concentration gradient in which the concentration of an element present in the shell is decreased toward a center. Examples of the shell of the quantum dot having the core-shell structure may include metal oxides, non-metal oxides, semiconductor compounds, and combinations thereof.

For example, the metal oxide and/or non-metal oxide may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), and/or a ternary compound (such as $MgAl_2O_4$, $CoFe_2O_4$, $NiFe_2O_4$, and/or $CoMn_2O_4$), but an embodiment of the present disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto The quantum dot may have a full width of half maximum (FWHM) of emission wavelength spectrum of about 45 nm or less, for example, about 40 nm or less, or about 30 nm or less. Within any of these ranges, color purity and/or color reproducibility may be improved. In addition, light emitted via such quantum dot may be emitted in all directions, and a wide view angle may be improved.

In some embodiments, the shape of the quantum dot may be any suitable shape used in the art, without specific limitation. For example, spherical, pyramidal, multi-arm, and/or cubic nanoparticle, nanotube, nanowire, nanofiber, nanoplate particle shape, etc. may be used.

The quantum dot may control the color of emitted light according to the average diameter of a particle, and accordingly, the quantum dot may have various emission colors such as blue, red and/or green. With the decrease of the average diameter of the particle of the quantum dot, light in a short wavelength range may be emitted. For example, in the quantum dots having the same core, the particle size of the quantum dot emitting green light may be smaller than the particle size of the quantum dot emitting red light. In addition, in the quantum dots having the same core, the particle size of the quantum dot emitting blue light may be smaller than the particle size of the quantum dot emitting green light. However, the embodiments are not limited thereto. The particle sizes of the quantum dots may be adjusted according to the material and thickness of the shell, even in the quantum dots having the same core.

In some embodiments, when the quantum dots have various emission colors such as blue, red, and/or green, the quantum dots having different emission colors may have different core materials.

In the light emitting element ED of an embodiment, the light emission layer EL may include a host and a dopant. In an embodiment, the light emission layer EL may include the quantum dot QD as a dopant material. Also, in an embodiment, the light emission layer EL may further include a host material.

In the light emitting element ED of an embodiment, the light emission layer EL may emit fluorescence. For example, the quantum dot QD may be used as a fluorescence dopant material.

The light emission layer EL may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method. For example, the light emission layer EL may be formed by providing the quantum dot composition of an embodiment through inkjet printing.

In the light emitting element ED of an embodiment, the electron transport region ETR may be positioned on the light emission layer EL. The electron transport region ETR may include at least one selected from a hole blocking layer, an electron transport layer ETL, and an electron injection layer EIL. However, an embodiment of the present disclosure is not limited thereto.

The electron transport region ETR may have a single layer formed of a single material, a single layer formed of a plurality of different materials, or a multilayer structure having a plurality of layers formed of a plurality of different materials.

For example, the electron transport region ETR may have the structure of a single layer such as an electron injection layer EIL, or an electron transport layer ETL, and may have a structure of a single layer formed of an electron injection material and an electron transport material. In some embodiments, the electron transport region ETR may have a single layer structure having a plurality of different materials, or a structure of electron transport layer ETL/electron injection layer EIL, or hole blocking layer/electron transport layer ETL/electron injection layer EIL, which are laminated in order from the light emission layer EL, but an embodiment of the present disclosure is not limited thereto. The thickness of the electron transport region ETR may be, for example, from about 200 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. However, an embodiment of the present disclosure is not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof. The thickness of the electron transport layer ETL may be from about 100 Å to about 1,000 Å and may be, for example, from about 150 Å to about 500 Å. If the thickness of the electron transport layer ETL satisfies the above-described range, satisfactory (or suitable) electron transport properties may be obtained without substantial increase in a driving voltage.

If the electron transport region ETR includes the electron injection layer EIL, the electron transport region ETR may include a halogenated metal, a lanthanum group metal (e.g., a lanthanoide metal), or a co-deposition material of a halogenated metal and a lanthanum group metal (e.g., a co-deposition material of a metal in lanthanoides and a metal halide). In some embodiments, the halogenated metal may be an alkali metal halide. For example, the electron transport region ETR may include LiF, lithium quinolate (LiQ), $Li_2O$, BaO, NaCl, CsF, Yb, RbCl, RbI, KI, and/or KI:Yb, but an embodiment of the present disclosure is not limited thereto. The electron injection layer EIL may be formed of a mixture material of an electron transport material and an insulating organo metal salt. For example, the organo metal salt may include metal acetates, metal benzoates, metal acetoacetates, metal acetylacetonates, and/or metal stearates. The thickness of the electron injection layer EIL may be from about 1 Å to about 100 Å, for example, from about 3 Å to about 90 Å. If the thickness of the electron injection layer EIL satisfies the above described range, satisfactory (or suitable) electron injection properties may be obtained without inducing a substantial increase in a driving voltage.

The electron transport region ETR may include a hole blocking layer. The hole blocking layer may include, for example, at least one of 2,9-dimethyl-4,7-diphenyl-1,10-phenanthroline (BCP) or 4,7-diphenyl-1,10-phenanthroline (Bphen). However, an embodiment of the present disclosure is not limited thereto.

The second electrode EL2 may be on the electron transport region ETR. The second electrode EL2 may be a common electrode and/or a cathode. The second electrode EL2 may be a transmissive electrode, a semi-transparent electrode or a reflective electrode. If the second electrode EL2 is the transmissive electrode, the second electrode EL2 may include a transparent metal oxide, for example, indium tin oxide (ITO), indium zinc oxide (IZO), zinc oxide (ZnO), indium tin zinc oxide (ITZO), etc.

If the second electrode EL2 is the semi-transparent electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the second electrode EL2 may have a multilayered structure including a transparent conductive layer formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. If the second electrode EL2 is connected with the auxiliary electrode, the resistance of the second electrode EL2 may be decreased. Referring to FIGS. 6 to 9, the modified quantum dot MQD may be derived from the quantum dot composition QCP. For example, the modified quantum dot MQD may refer to a quantum dot generated by the reaction of the quantum dot QD, an additive AD, and a precursor P-ML of the quantum dot composition QCP. As shown in FIG. 6, the quantum dot composition QCP of an embodiment may be provided through a nozzle NZ on the hole transport region HTR of the light emitting element ED. The quantum dot composition QCP may be provided in a region corresponding to the hole transport region HTR between portions of a pixel defining layer PDL. The quantum dot composition QCP provided on the hole transport region HTR may be reacted to form the modified quantum dot MQD.

Referring to FIGS. 7 and 8, the quantum dot composition QCP of an embodiment may include a quantum dot QD, a ligand LD to bind (e.g., binding or bound) to the quantum dot QD surface, an additive AD, and a precursor P-ML. The ligand LD may bind to the surface of the quantum dot QD. The ligand LD of an embodiment may bind to a cation binding portion CP of a shell SL. The ligand LD may include an organic and/or inorganic substance. For example, the ligand LD may be oleic acid. In the ligand LD

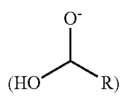

illustrated in FIG. 8, R may be an alkyl group having 1 to 20 carbon atoms. However, examples of the ligand LD are not limited thereto.

The additive AD includes an amine group. For example, the additive AD may be an amine compound. In some embodiments, the additive AD may be a primary amine or a secondary amine compound. The additive AD may have a structure

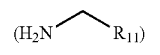

shown in FIG. 8. In the above structural formula, $R_{11}$ may be an alkyl group having 1 to 20 carbon atoms.

The precursor P-ML includes an organometallic compound. In some embodiments, the organometallic compound includes oxygen and/or sulfur. For example, the precursor P-ML may include at least one selected from MO(O)—C—$R_1$, MS(S)—C—R1, MO(O)—C—NH—$R_1$, MS(S)—C—NH—$R_1$, MO(O)—CN—$R_1$, MS(S)—CN—$R_1$, MO(O)—CO—$R_1$, MS(S)—CO—$R_1$, MO(O)—[C(O)OC(O)O]n, and MS(S)—[C(O)OC(O)O]n. $R_1$ in the precursor P-ML may be an alkyl group having 1 to 20 carbon atoms. n may be an integer of 1 to 10. M may be at least one selected from Cd, Zn, Ir, Ga, Pd, Cu, Ag, Au, Rh, Ir, Ru, and Os. For example, M may be Cd, Zn, Ir or Ga.

The additive AD and the precursor P-ML of an embodiment may react according to a reaction mechanism represented by Reaction Formula 1 below:

Reaction Formula 1

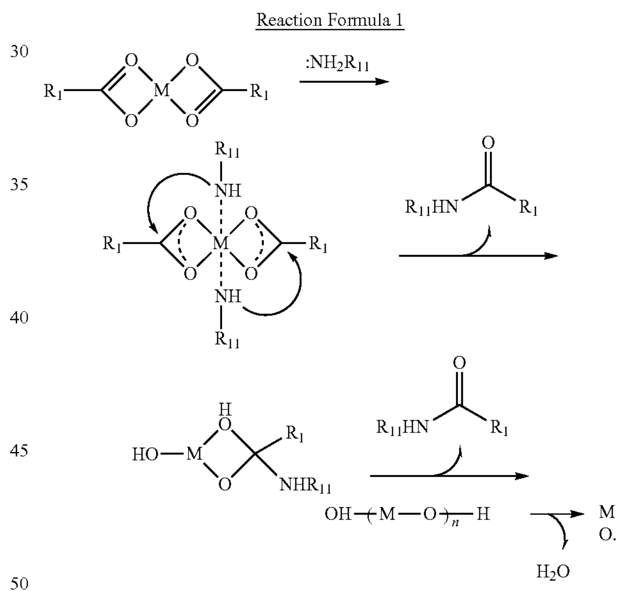

$R_1$ and $R_{11}$ in Reaction Formula 1 may be an alkyl group having 1 to 20 carbon atoms. M may include at least one selected from Cd, Zn, Ir, Ga, Pd, Cu, Ag, Au, Rh, Ir, Ru, or Os. For example, M may be Cd, Zn, Ir and Ga.

The Reaction Formula 1 shows a step of a nucleophilic attack reaction between the amine compound

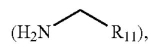

which is the additive AD, and the precursor P-ML. In an embodiment, the reaction molar ratio of the precursor P-ML to the additive AD may be 1:2.

The nucleophilic attack reaction produces a metal compound ML from the precursor P-ML. For example, the metal compound ML may be derived from the nucleophilic attack reaction of the precursor P-ML and the additive AD. The modified quantum dot MQD may have a modified surface characteristic compared to the quantum dot QD before the reaction, as a metal compound ML is attached to the surface of the quantum dot QD. In some embodiments, the metal compound ML may bind to the anion binding portion AP of the shell SL. For example, the metal compound ML may be a Z-type ligand. The metal compound ML may be a Lewis acid, which receives an electron pair at an anion binding portion AP of the shell SL.

The modified quantum dot MQD may be formed by binding the metal compound ML generated from the nucleophilic attack reaction to the anion binding portion AP. The modified quantum dot MQD may have a modified surface characteristic by attaching the metal compound ML to the surface of the quantum dot QD.

The modified quantum dot MQD of an embodiment may have a form in which both the ligand LD and the metal compound ML binds to the quantum dot QD. For example, the metal compound ML may bind to the anion binding portion AP, in addition to the cation binding portion CP to which the ligand LD may bind. Accordingly, the metal compound ML may bind to the surface of the quantum dot QD, regardless of the type (or kind) of the ligand LD binding to the quantum dot QD.

In some embodiments, the modified quantum dot MQD, which is formed when a metal compound ML additionally binds to the anion binding portion AP of the shell SL of the quantum dot QD, may have a modified surface characteristic without being greatly (significantly) affected in terms of physical properties such as solubility and/or stability of the quantum dot QD before surface treatment.

The quantum dot composition QCP of an embodiment may further include an organic solvent SV. For example, the organic solvent SV may include hexane, toluene, chloroform, dimethyl sulfoxide, and/or dimethyl formamide. However, the embodiment is not limited thereto.

The quantum dots QD may be provided by being dispersed in the organic solvent SV. The ligand LD may bind to the surface of the quantum dot QD to increase the dispersibility of the quantum dot QD in the organic solvent SV.

Figure 10:
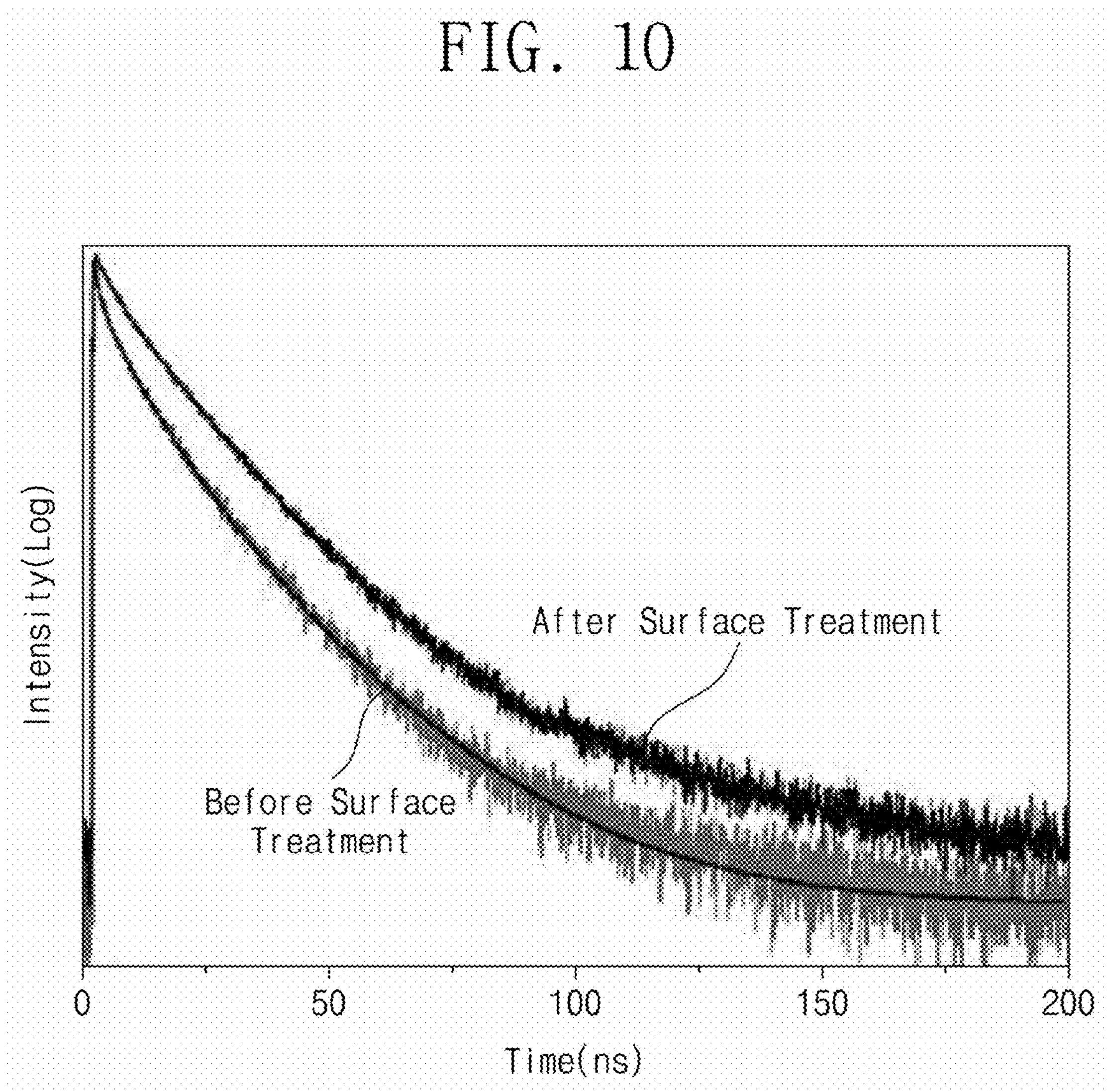
FIG. 10 is a graph showing analysis results of the luminous efficiencies and intensities of a quantum dot before and after surface treatment.
Figure 11A:
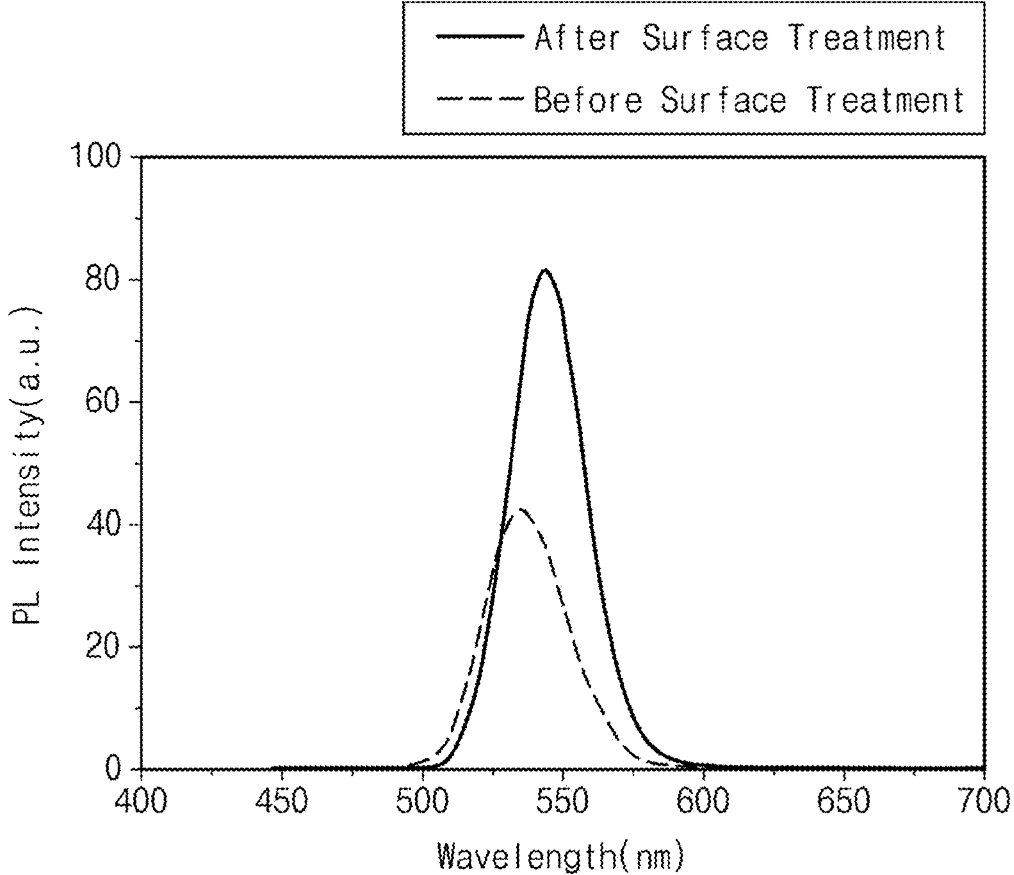
FIG. 11A is a photoluminescence spectrum graph of a quantum dot before and after surface treatment.
Figure 11B:
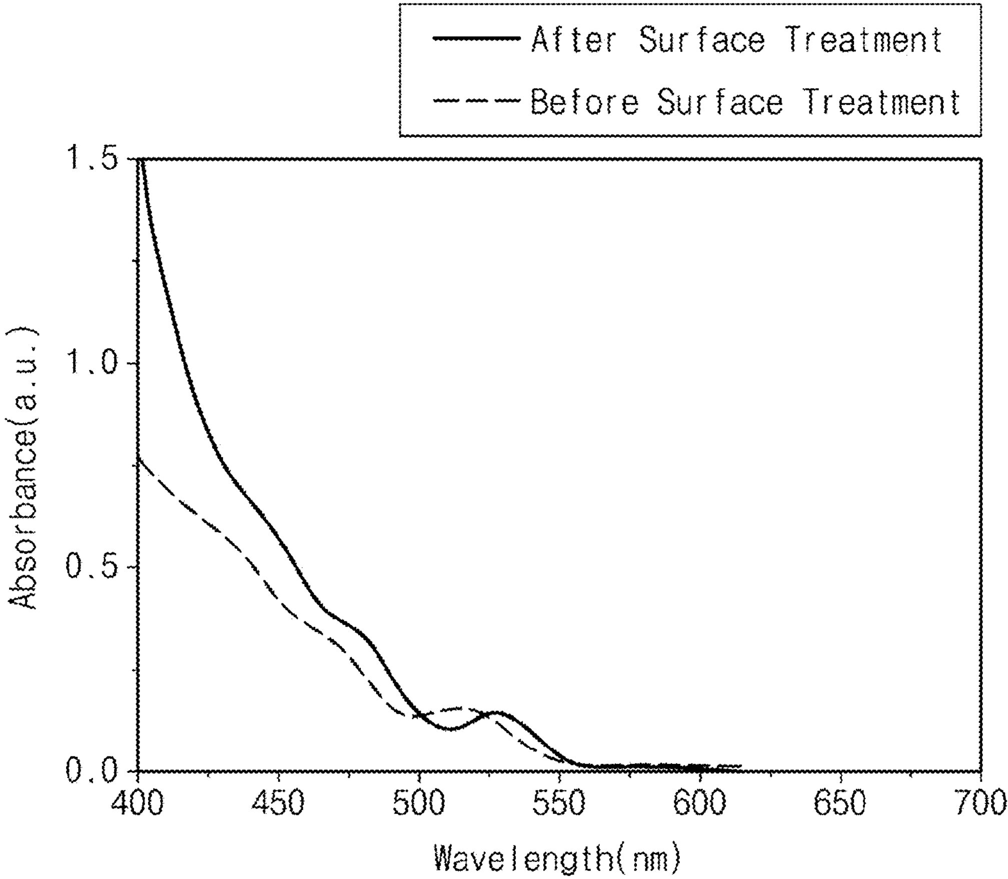
FIG. 11B is an absorption spectrum graph of a quantum dot before and after surface treatment.

FIG. 10 is a graph showing results of analyzing luminous efficiency and intensity of the quantum dot QD before and after surface treatment. FIG. 11A is a photoluminescence spectrum graph of the quantum dot before and after surface treatment. FIG. 11B is an absorption spectrum graph of the quantum dot before and after surface treatment.

In FIGS. 10, 11A and 11B, the graph of the quantum dot before surface treatment is an analysis graph of the quantum dots QD in which the metal compound ML is not bound to the surface, and the graph of the quantum dot after surface treatment is an analysis graph of the modified quantum dot including the metal compound ML bound to the surface. Surface treatment may refer to binding the metal compound ML to the anion binding portion AP of the quantum dot QD.

As shown in FIG. 10, in the case of the light emitting element including the modified quantum dot MQD after surface treatment, compared with the light emitting element containing the quantum dot QD before surface treatment, it can be seen that half-lifetime is increased. For example, it can be seen that the light emitting element in which the modified quantum dot MQD is used in the light emission layer may exhibit improved lifespan and luminous efficiency.

Referring to FIG. 11A, it can be seen that light emission intensity of the modified quantum dot MQD increases at the same concentration based on the absorption peak of the first excitation. Referring to FIG. 11B, it can be seen that the absorbance of the modified quantum dot MQD in the short wavelength range is increased by surface treatment as compared with the absorbance of the quantum dot QD before surface treatment.

According to the present embodiments, compared to the quantum dot QD before the reaction, the modified quantum dot MQD whose surface is modified (after surface treatment) may have increased light absorbing characteristic in the short wavelength region, and increased light emission intensity, than before surface treatment.

Figure 12:
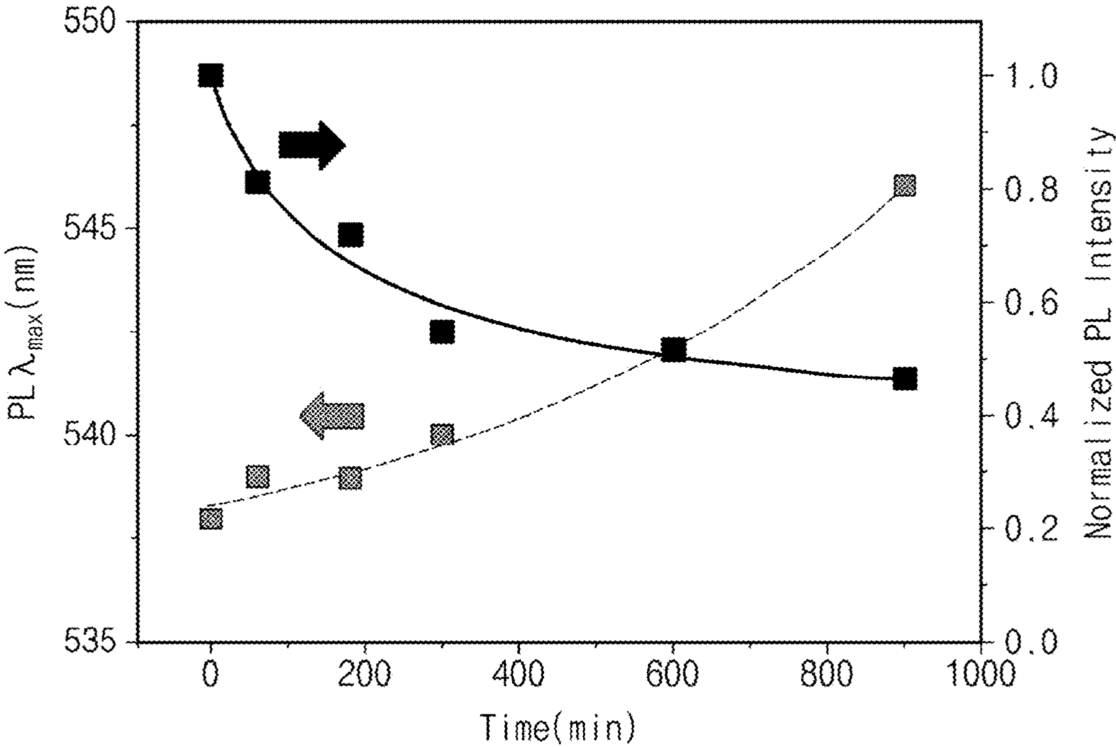
FIGS. 12 and 13 are graphs showing analysis results of quantum dot stability before and after the reaction, respectively.
Figure 13:
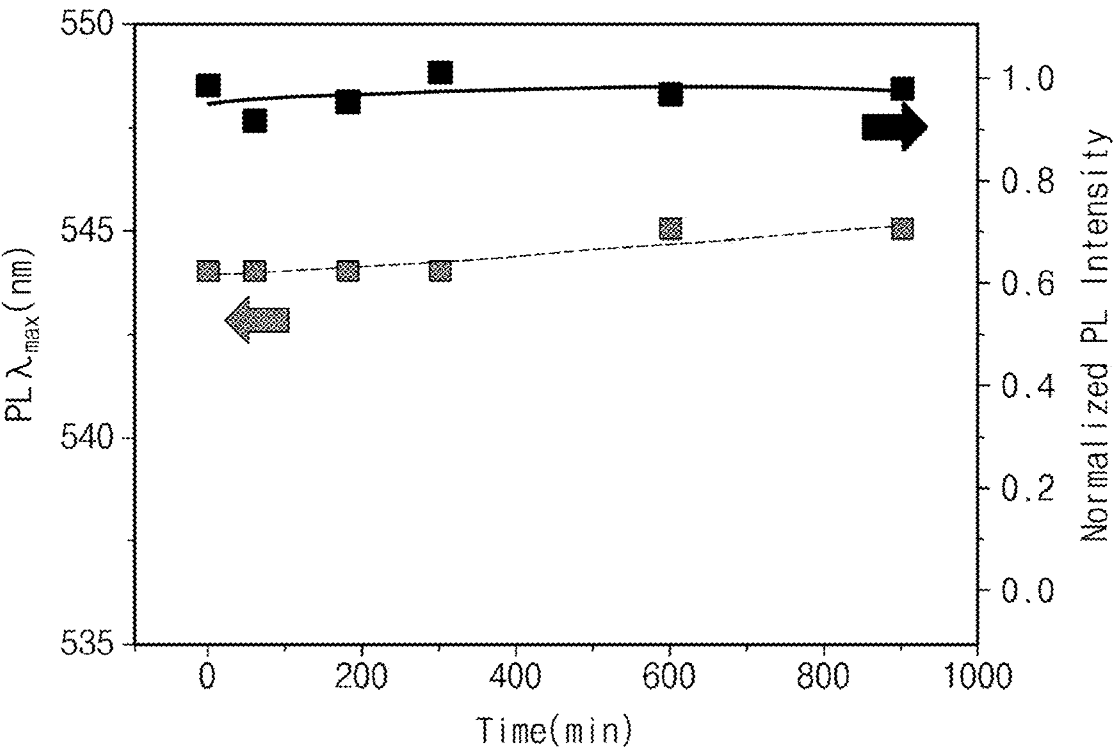

FIGS. 12 and 13 are graphs of results of analyzing the stability of the quantum dot QD and the modified quantum dot MQD, respectively. In FIGS. 12 and 13, a change over time was measured by irradiating light to each of the quantum dot QD and the modified quantum dot MQD for 15 hours at an intensity of 757 $mW/cm^2$ using a 200 W-halogen lamp. As time passed, in the quantum dot QD before surface treatment, the light emission wavelength value gradually increased resulting in a decrease in luminance. In contrast, the modified quantum dot MQD maintained a substantially constant light emission wavelength value and luminance regardless of the passage of time.

It is therefore believed that the modified quantum dot MQD of an embodiment has improved luminous efficiency, long life and stability, compared to the quantum dot QD before surface treatment. Accordingly, the light emitting element ED may provide improved luminous efficiency and long life by including the modified quantum dot MQD in the light emission layer EL.

Figure 14:
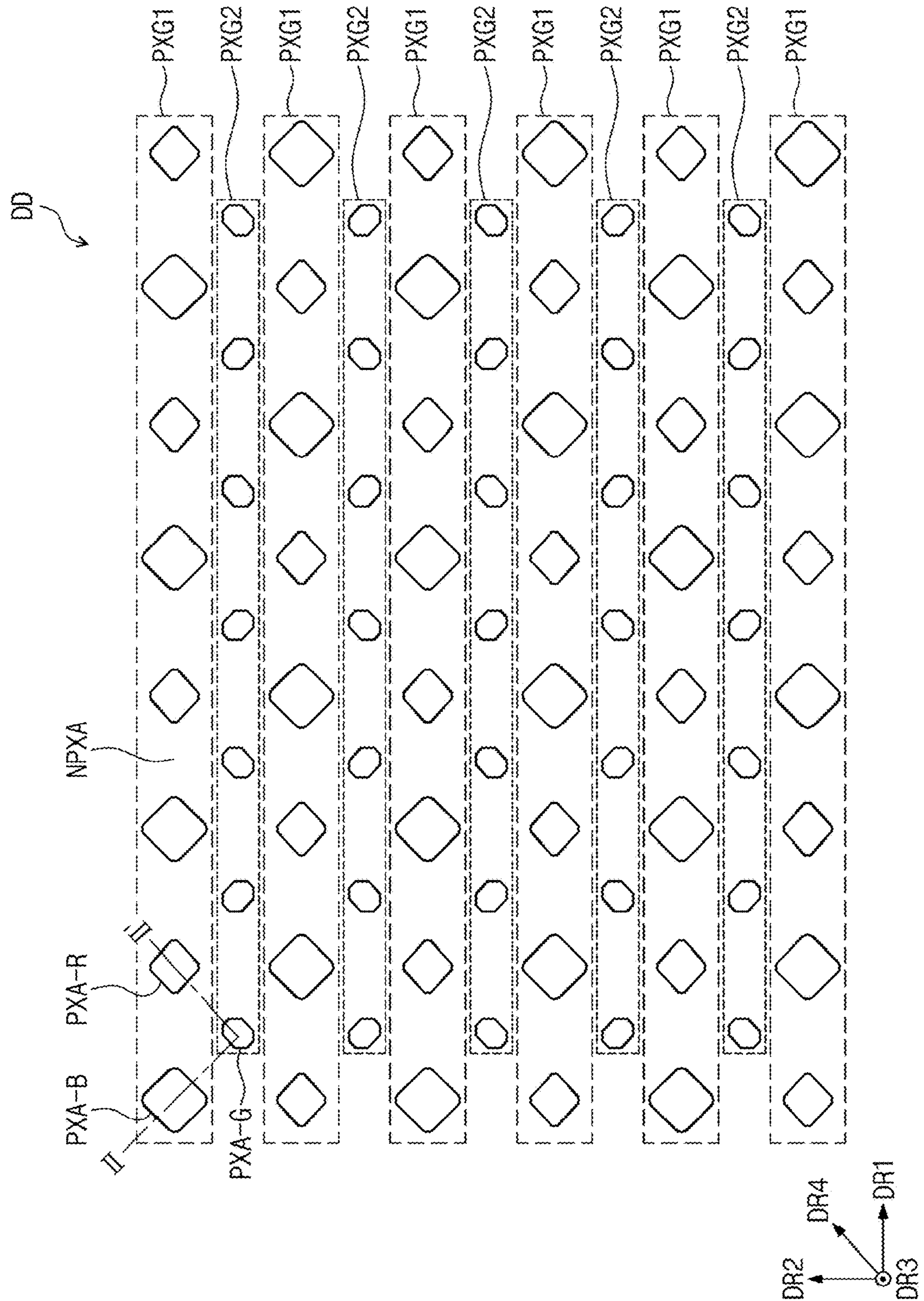
FIG. 14 is a plan view of a display device according to an embodiment of the present disclosure.
Figure 15:
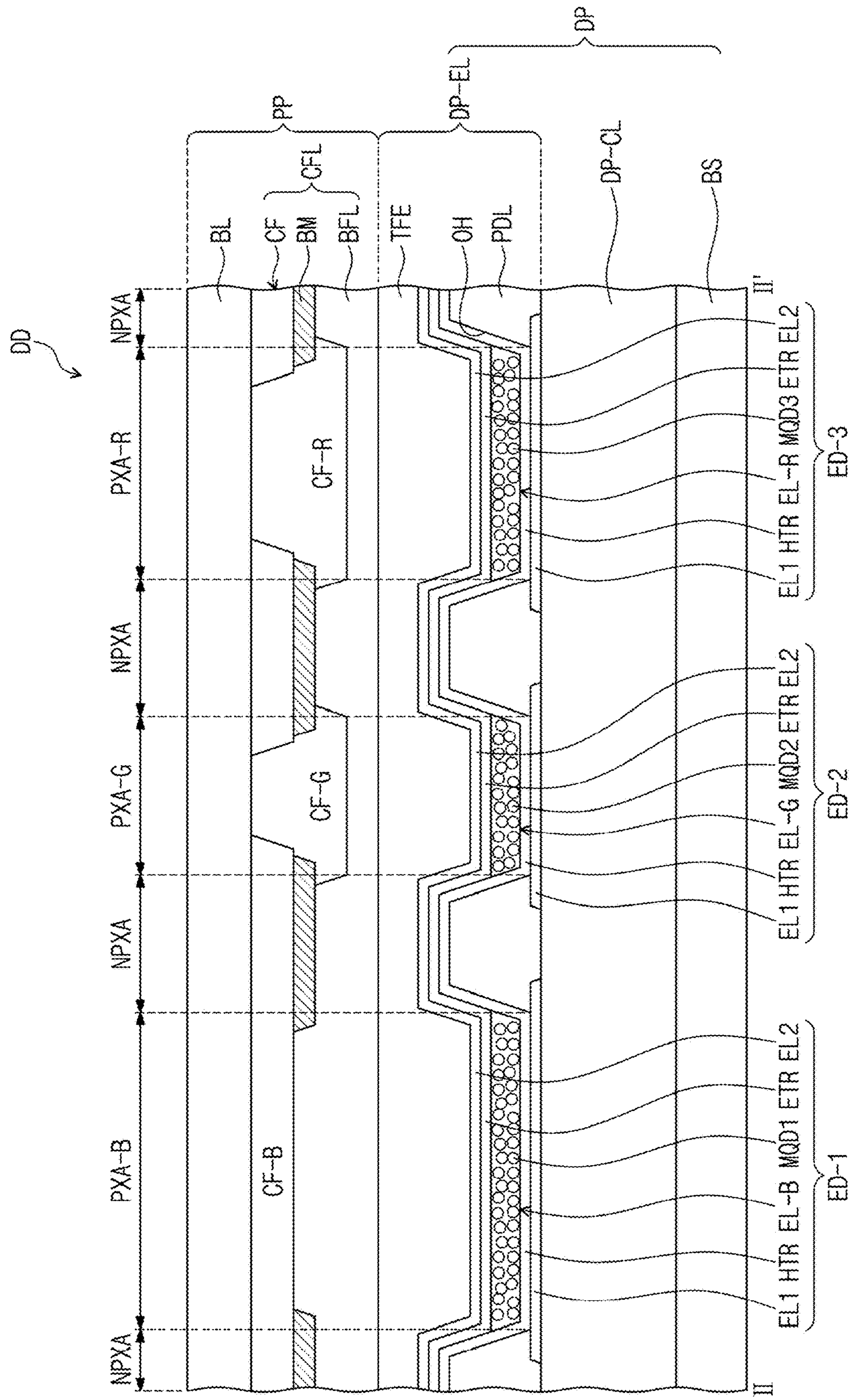
FIG. 15 is a cross-sectional view of a display device according to an embodiment of the present disclosure taken along line II-II' of FIG. 14.

FIG. 14 is a plan view of a display device DD according to an embodiment of the present disclosure. FIG. 15 is a cross-sectional view of a display device DD according to an embodiment of the present disclosure. FIG. 15 is a cross-sectional view taken along to line II-II' in FIG. 14.

The display device DD of an embodiment may include a plurality of light emitting elements ED-1, ED-2 and ED-3, and the light emitting elements ED-1, ED-2 and ED-3 may respectively include light emission layers EL-B, EL-G and EL-R which include modified quantum dots MQD1, MQD2 and MQD3, respectively In some embodiments, the display device DD of an embodiment may include a display panel DP including the plurality of light emitting elements ED-1, ED-2 and ED-3, and a light controlling layer PP on the display panel DP. In some embodiments, the light controlling layer PP may be omitted from the display device DD of an embodiment.

The display panel DP may include a base substrate BS, a circuit layer DP-CL and a display element layer DP-EL provided on the base substrate BS, and the display element layer DP-EL may include a pixel defining layer PDL, the light emitting elements ED-1, ED-2 and ED-3 separated by the pixel defining layer PDL, and an encapsulation layer TFE on the light emitting elements ED-1, ED-2 and ED-3.

Referring to FIGS. 14 and 15, the display device DD may include a non-emission region NPXA and emission regions PXA-B, PXA-G and PXA-R. Each of the emission regions PXA-B, PXA-G and PXA-R may be a region emitting light produced from each of the light emitting elements ED-1, ED-2 and ED-3. The light emitting regions PXA-B, PXA-G and PXA-R may be spaced apart from each other on a plane.

The emission regions PXA-B, PXA-G and PXA-R may be divided into a plurality of groups according to the color of light produced in the light emitting elements ED-1, ED-2 and ED-3. In the display device DD of an embodiment as shown in FIG. 14 and FIG. 15, three emission regions PXA-B, PXA-G and PXA-R emitting blue light, green light and red light are shown as an example. For example, the display device DD of an embodiment may include a blue emission region PXA-B, a green emission region PXA-G and a red emission region PXA-R, which are distinguished from each other.

A plurality of light emitting elements ED-1, ED-2 and ED-3 may emit lights in different wavelength regions. For example, in an embodiment, the display device DD may include a first light emitting element ED-1 emitting blue light, a second light emitting element ED-2 emitting green light, and a third light emitting element ED-3 emitting red light. However, an embodiment of the present disclosure is not limited thereto, and the first to third light emitting elements ED-1, ED-2 and ED-3 may emit light in the same wavelength region, or at least one thereof may emit light in a different wavelength region.

For example, the blue emission region PXA-B, the green emission region PXA-G, and the red emission region PXA-R of the display device DD may correspond to the first light emitting element ED-1, the second light emitting element ED-2, and the third light emitting element ED-3, respectively.

The first emission layer EL-B of the first light emitting element ED-1 may include a first modified quantum dot MQD1. The first modified quantum dot MQD1 may emit blue light, which is the first color light.

The second emission layer EL-G of the second light emitting element ED-2 and the third emission layer EL-R of the third light emitting element ED-3 may include a second modified quantum dot MQD2 and a third modified quantum dot MQD3, respectively. The second modified quantum dot MQD2 and the third modified quantum dot MQD3 may emit green light, which is the second color light, and red light, which is the third color light, respectively.

Each of the first to third modified quantum dots MQD1, MQD2, and MQD3 may have a quantum dot and a metal compound ML binding to the quantum dot surface. For each of the first to third modified quantum dots MQD1, MQD2, and MQD3, the descriptions of the modified quantum dots MQD for the light emitting element ED of the above-described embodiment may be equally applied.

Each of the first to third light emission layers EL-B, EL-G, and EL-R including the first to third modified quantum dots MQD1, MQD2, and MQD3 may be derived from a quantum dot composition including a quantum dot, a ligand binding to the quantum dot surface, and an additive, and a precursor including an organometallic compound having oxygen and/or sulfur.

In an embodiment, the first to third modified quantum dots MQD1, MQD2 and MQD3, included in the light emitting elements ED-1, ED-2 and ED-3 may be formed of different core materials from each other. In some embodiments, the first to third modified quantum dots MQD1, MQD2 and MQD3 may be formed of the same core material, or two selected among the first to third modified quantum dots MQD1, MQD2 and MQD3 may be formed of the same core material and the remaining one may be formed of a different core material.

In the display device DD of an embodiment, as shown in FIG. 14 and FIG. 15, the areas of the emission regions PXA-B, PXA-G and PXA-R may be different from each other. In this description, the area may refer to an area when viewed on a plane defined by the first direction DR1 and the second direction DR2.

The emission regions PXA-B, PXA-G and PXA-R may have different areas according to the color emitted from the light emission layers EL-B, EL-G and EL-R of the light emitting elements ED-1, ED-2 and ED-3. For example, referring to FIG. 14 and FIG. 15, the blue emission region PXA-B corresponding to the first light emitting element ED-1, which is to emit blue light, may have the largest area, and the green emission region PXA-G corresponding to the second light emitting element ED-2, which is to generate (emit) green light, may have the smallest area in the display device DD of an embodiment. However, an embodiment of the present disclosure is not limited thereto, and the emission regions PXA-B, PXA-G and PXA-R may emit light other than blue light, green light and red light, or the emission regions PXA-B, PXA-G and PXA-R may have the same area, or the emission regions PXA-B, PXA-G, and PXA-R may be provided at different area ratios than those shown in FIG. 14.

Each of the emission regions PXA-B, PXA-G and PXA-R may be a region divided by a pixel defining layer PDL. The non-emission regions NPXA may be regions between neighboring emission regions PXA-B, PXA-G and PXA-R and may correspond to the pixel defining layer PDL. In some embodiments, each of the emission regions PXA-B, PXA-G and PXA-R may correspond to a pixel in the present disclosure. The pixel defining layer PDL may divide (separate) the light emitting elements ED-1, ED-2 and ED-3. The light emission layers EL-B, EL-G and EL-R of the light emitting elements ED-1, ED-2 and ED-3 may each independently be formed in one or more openings OH defined by the pixel defining layer PDL.

The pixel defining layer PDL may be formed of a polymer resin. For example, the pixel defining layer PDL may be formed by including a polyacrylate-based resin and/or a polyimide-based resin. In some embodiments, the pixel defining layer PDL may be formed by additionally including an inorganic material, in addition to the polymer resin. In some embodiments, the pixel defining layer PDL may be formed by including a light absorbing material or may be formed by including a black pigment and/or a black dye. The pixel defining layer PDL formed by including the black pigment and/or the black dye may embody a black pixel defining layer. In forming the pixel defining layer PDL, carbon black may be used as the black pigment and/or the black dye, but an embodiment of the present disclosure is not limited thereto.

In some embodiments, the pixel defining layer PDL may be formed of an inorganic material. For example, the pixel defining layer PDL may be formed by including silicon nitride ($SiN_x$), silicon oxide ($SiO_x$), silicon oxynitride ($SiO_xN_y$), etc. The pixel defining layer PDL may define the emission regions PXA-B, PXA-G and PXA-R. By the pixel defining layer PDL, the emission regions PXA-B, PXA-G and PXA-R and the non-emission region NPXA may be divided (separated).

Each of the light emitting elements ED-1, ED-2 and ED-3 may include a first electrode EL1, a hole transport region HTR, one of the emission layers EL-B, EL-G and EL-R an electron transport region ETR, and a second electrode EL2. The same descriptions as those provided above with reference to FIG. 4 may be applied to the first electrode EL1, the hole transport region HTR, the electron transport region ETR, and the second electrode EL2, except that the modified quantum dots MQD1, MQD2 and MQD3 included in the light emission layers EL-B, EL-G, and EL-R are different from each other in the light emitting elements ED-1, ED-2, and ED-3 included in the display device DD of an embodiment.

The encapsulation layer TFE may cover the light emitting elements ED-1, ED-2 and ED-3. The encapsulation layer TFE may be one layer or a laminated layer of a plurality of layers. The encapsulation layer TFE may be a thin film encapsulation layer. The encapsulation layer TFE protects the light emitting elements ED-1, ED-2 and ED-3. The encapsulation layer TFE may cover the top surface of the second electrode EL2 provided in the opening OH, and may fill the opening OH.

In FIG. 15, the hole transport region HTR and the electron transport region ETR are illustrated as a common layer covering the pixel defining layer PDL, but the present embodiments are not limited thereto. In an embodiment, the hole transport region HTR and the electron transport region ETR may be provided in the opening OH defined in the pixel defining layer PDL.

For example, when not only the light emission layers EL-B, EL-G, and EL-R but also the hole transport region HTR and the electron transport region ETR are provided by the inkjet printing method, the hole transport region HTR, the light emission layers EL-B, EL-G, and EL-R the electron transport region ETR, and/or the like may be provided to correspond to the one or more defined openings OH in the pixel defining layer PDL. However, the embodiment is not limited thereto, and as shown in FIG. 15, the hole transport region HTR and the electron transport region ETR may not be patterned, may cover the pixel defining layer PDL, and may be provided as one common layer regardless of a method of providing each functional layer.

Meanwhile, in the display device DD of an embodiment illustrated in FIG. 15, although the thickness of the light emission layers EL-B, EL-G, and EL-R of the first to third light emitting elements ED-1, ED-2, and ED-3 is similar to each other, the embodiment is not limited thereto. For example, in an embodiment, the thicknesses of the light emission layers EL-B, EL-G, and EL-R of the first to third light emitting devices ED-1, ED-2, and ED-3 may be different from each other.

Referring to FIG. 14, the blue emission regions PXA-B and the red emission regions PXA-R may be alternately arranged in a first direction DR1 to form a first group PXG1. The green emission regions PXA-G may be arranged in the first direction DR1 to form a second group PXG2.

The first group PXG1 and the second group PXG2 may be spaced apart in a second direction DR2. Each of the first group PXG1 and the second group PXG2 may be provided in plural. The first groups PXG1 and the second groups PXG2 may be alternately arranged in the second direction DR2.

One green emission region PXA-G may be spaced apart from one blue emission region PXA-B and/or one red emission region PXA-R in a fourth direction DR4. The fourth direction DR4 may be a direction between the first direction DR1 and the second direction DR2.

The arrangement structure of the emission regions PXA-B, PXA-G and PXA-R shown in FIG. 14 may have a pantile structure. However, the arrangement structure of the emission regions PXA-B, PXA-G and PXA-R in the display device DD according to an embodiment is not limited to the arrangement structure shown in FIG. 14. For example, in an embodiment, the emission regions PXA-B, PXA-G and PXA-R may have a stripe structure, wherein the blue emission region PXA-B, the green emission region PXA-G and the red emission region PXA-R may be alternately arranged along the first direction DR1.

Referring to FIG. 3 and FIG. 15, the display device DD of an embodiment further includes a light controlling layer PP. The light controlling layer PP may block or reduce external light incident to the display panel DP from the exterior of the display device DD. The light controlling layer PP may block or reduce a portion of the external light. The light controlling layer PP may show reflection preventing (or reflection reducing) function by which reflection of external light is minimized or reduced.

In an embodiment shown in FIG. 15, the light controlling layer PP may include a color filter layer CFL. For example, the display device DD of an embodiment may further include the color filter layer CFL on the light emitting elements ED-1, ED-2 and ED-3 of the display panel DP.

In the display device DD of an embodiment, the light controlling layer PP may include a base layer BL and the color filter layer CFL.

The base layer BL may be a member providing a base surface where the color filter layer CFL, etc. is positioned. The base layer BL may be a glass substrate, a metal substrate, a plastic substrate, etc. However, an embodiment of the present disclosure is not limited thereto, and the base layer BL may be an inorganic layer, an organic layer, or a composite material layer.

The color filter layer CFL may include a light blocking part BM and a color filtering part CF. The color filtering part CF may include a plurality of filters CF-B, CF-G and CF-R. For example, the color filtering layer CFL may include a first filter CF-B which transmits the first color light, a second filter CF-G which transmits the second color light, and a third filter CF-R which transmits the third color light. For example, the first filter CF-B may be a blue filter, the second filter CF-G may be a green filter, and the third filter CF-R may be a red filter.

The filters CF-B, CF-G and CF-R each may include a polymer photosensitive resin and a pigment and/or dye. The first filter CF-B may include a blue pigment and/or dye, the second filter CF-G may include a green pigment and/or dye, and the third filter CF-R may include a red pigment and/or dye.

However, an embodiment of the present disclosure is not limited thereto, and the first filter CF-B may not include a pigment or a dye. For example, the first filter CF-B may include a polymer photosensitive resin, and not include a pigment or a dye. The first filter CF-B may be transparent. The first filter CF-B may be formed of a transparent photosensitive resin.

The light blocking part BM may be a black matrix. The light blocking part BM may be formed by including an organic light blocking material or an inorganic light blocking material, including a black pigment and/or black dye. The light blocking part BM may prevent or reduce light leakage phenomenon and divide boundaries between adjacent filters CF-B, CF-G and CF-R.

The color filter layer CFL may further include a buffer layer BFL. For example, the buffer layer BFL may be a protection layer protecting the filters CF-B, CF-G and CF-R. The buffer layer BFL may include an inorganic layer including at least one inorganic material selected from silicon nitride, silicon oxide, and silicon oxynitride. The buffer layer BFL may be formed as a single layer or a plurality of layers.

In an embodiment shown in FIG. 15, the first color filter CF-B of the color filter layer CFL is shown to be overlapped with the second filter CF-G and the third filter CF-R, but an embodiment of the present disclosure is not limited thereto.

For example, the first to third filters CF-B, CF-G and CF-R may be divided by the light blocking part BM and may not overlap with each other. In an embodiment, the first to third filters CF-B, CF-G and CF-R may be provided correspondingly to the blue emission region PXA-B, green emission region PXA-G and red emission region PXA-R, respectively.

In some embodiments, the display device DD of an embodiment may include a polarization layer in a light control layer PP, instead of the color filter layer CFL. The polarization layer may block or reduce external light incident to (on) the display panel DP. The polarization layer may block or reduce a portion among the external light.

In some embodiments, the polarization layer may reduce reflected light generated in the display panel DP by external light. For example, the polarization layer may function to block or reduce reflected light in case where light from exterior of the display device DD is incident to (on) the display panel DP, is reflected by the display panel DP, and exits again from the display panel DP. The polarization layer may be a circular polarizer having reflection preventing (or reflection reducing) function or the polarization layer may include a linear polarizer and a $\lambda/4$ phase retarder. In some embodiments, the polarization layer may be exposed by being on the base layer BL or the polarization layer may be under the base layer BL.

Figure 16:
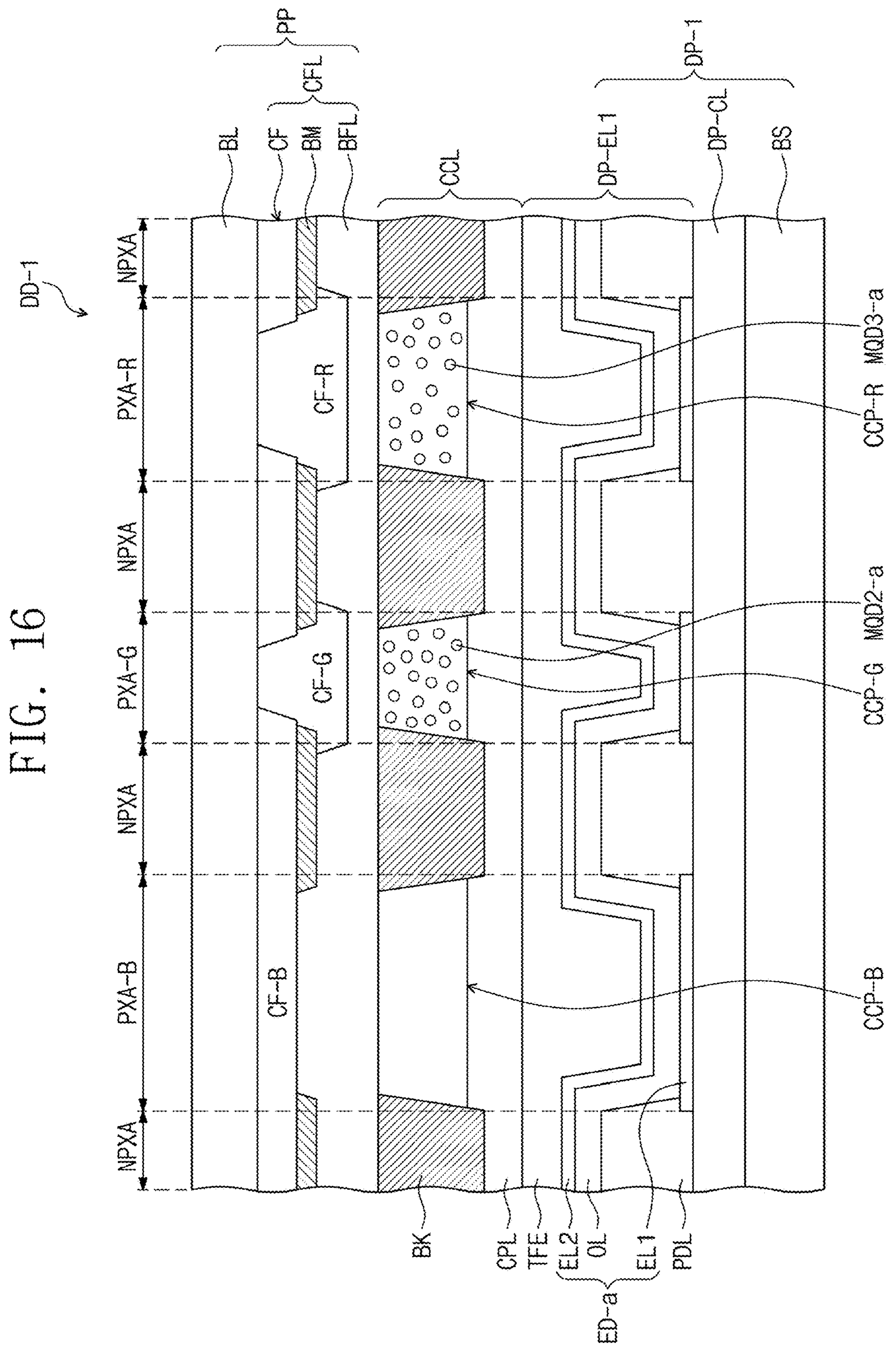
FIG. 16 is a cross-sectional view of a display device according to an embodiment of the present disclosure.

FIG. 16 is a cross-sectional view of a display device DD-1 of an embodiment. In the description of the display device DD-1 according to an embodiment, contents (descriptions) overlapping with those provided above with reference to FIGS. 1 to 15 will not be provided again, and the differences will be mainly described.

Referring to FIG. 16, the display device DD-1 may include a color conversion layer CCL on a display panel DP-1. In addition, the display device DD-1 may further include a color filter layer CFL. The color filter layer CFL may be between the base layer BL and the color conversion layer CCL.

The display panel DP-1 may be a light emitting display panel. For example, the display panel DP-1 may be an organic electroluminescence display panel or a quantum dot light emitting display panel.

The display panel DP-1 may include a base substrate BS, a circuit layer DP-CL on the base substrate BS, and a display element layer DP-EL1.

The display element layer DP-EL1 includes a light emitting element ED-a, and the light emitting element ED-a may include the first electrode EL1 and the second electrode EL2 facing each other, and a plurality of layers OL between the first electrode EL1 and the second electrode EL2. The plurality of layers OL may include a hole transport region HTR (FIG. 4), a light emission layer EL (FIG. 4), and an electron transport region ETR (FIG. 4). An encapsulation layer TFE may be on the light emitting element ED-a.

In the light emitting element ED-a, the same contents (descriptions) as those provided with reference to FIG. 4 may be applied to the first electrode EL1, the hole transport region HTR, the electron transport region ETR, and the second electrode EL2. In the light emitting element ED-a included in the display panel DP-1 of an embodiment, the light emission layer may include a host and a dopant, which are organic electroluminescent materials, or may include the modified quantum dot MQD described with reference to FIGS. 1 to 15. In the display panel DP-1 of an embodiment, the light emitting element ED-a may emit blue light.

The color conversion layer CCL may include a plurality of partition walls BK spaced apart from each other, and color control units CCP-B, CCP-G and CCP-R between the respective partition walls BK. The partition walls BK may be formed by including a polymer resin and a liquid repellent additive. The partition walls BK may be formed by including a light absorbing material, or may be formed by including a pigment and/or dye. For example, the partition walls BK may include a black pigment and/or black dye to implement a black partition wall. When forming the black partition wall, carbon black and/or the like may be used as the black pigment and/or black dye, but embodiments are not limited thereto.

The color conversion layer CCL may include a first color control unit CCP-B that transmits the first color light, a second color control unit CCP-G including a second modified quantum dot for converting (to convert) the first color light to the second color light, and a third color control unit CCP-R including a third modified quantum dot for converting (to convert) the first color light to the third color light. The second color light may be light of a longer wavelength region than the first color light, and the third color light may be light of a longer wavelength region than the first color light and the second color light. For example, the first color light may be blue light, the second color light may be green light, and the third color light may be red light. Regarding the modified quantum dots MQD2-*a* and MQD3-*a* included in the color control units CCP-B, CCP-G and CCP-R, the same contents (descriptions) as those of the modified quantum dots MQD2, MQD3 used in the light emission layer EL-G and EL-R illustrated in FIG. 15 may be applied.

The color conversion layer CCL may include a capping layer CPL. The capping layer CPL may be on the color control units CCP-B, CCP-G and CCP-R and the partition walls BK. The capping layer CPL may serve to prevent or reduce penetration of moisture and/or oxygen (hereinafter, referred to as "moisture/oxygen"). The capping layer may be on the color control units CCP-B, CCP-G and CCP-R to block or reduce the color control units CCP-B, CCP-G and CCP-R from being exposed to moisture/oxygen. The capping layer CPL may include at least one inorganic layer.

The display device DD-1 of an embodiment may include a color filter layer CFL on the color conversion layer CCL, and the descriptions provided in connection with FIG. 15 may be applied to the color filter layer CFL and the base layer BL of the present embodiment.

The display device DD-1 of an embodiment may exhibit excellent (or suitable) color reproducibility by including the modified quantum dots MQD2-*a* and MQD3-*a* (having a metal compound ML attached to a surface thereof) in the color conversion layer CCL.

In some embodiments, in the display device DD-1 of an embodiment, the light emitting element ED-a of the display panel DP-1 may include a light emission layer including a modified quantum dot MQD having a metal compound ML attached to a surface thereof, and in this case, the display panel DP-1 may exhibit excellent (or suitable) luminous efficiency.

A quantum dot composition of an embodiment may be used as a light emission layer material, which is capable of exhibiting improved lifespan and luminous efficiency characteristics, by applying surface treatment to the quantum dot surface by using a metal compound.

A light emitting element and a display device of embodiments may exhibit improved lifespan, luminous efficiency, and material stability by including, in a light emission layer, a modified quantum dot material having modified surface characteristics.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments of the present disclosure have been described, it will be understood that various changes and modifications can be made by one of ordinary skill in the art within the spirit and technical scope of the present disclosure described in the appended claims and their equivalents.

Accordingly, the technical scope of the present disclosure is to be determined by the following claims and their equivalents, and shall not be restricted or limited by the foregoing detailed description.

What is claimed is:

1. A light emitting element, comprising:

a first electrode;

a hole transport region on the first electrode;

a light emission layer on the hole transport region, and comprising a modified quantum dot, the modified quantum dot comprising:

a quantum dot comprising a core and a shell surrounding the core, and a metal compound comprising a metal oxide and/or a metal sulfide, the metal compound being discontinuously bound to the outermost surface of the quantum dot shell at separate portions of the outermost surface of the quantum dot shell;

an electron transport region on the light emission layer; and a second electrode on the electron transport region.

2. The light emitting element of claim 1, wherein the modified quantum dot further comprises:

a ligand bound to a surface of the quantum dot.

3. The light emitting element of claim 2, wherein:

the shell comprises a cation binding portion and an anion binding portion;

the ligand is bound to the cation binding portion; and the metal compound is bound to the anion binding portion.

4. The light emitting element of claim 1, wherein:

the light emission layer is formed from a quantum dot composition comprising a quantum dot, a ligand, an additive comprising an amine group, and a precursor comprising an organometallic compound, the final quantum dot composition of the light emission layer comprising the metal compound that is a product of a nucleophilic attack reaction between the additive and the precursor;

the ligand is bound to a surface of the quantum dot, the precursor comprises at least one selected from among M-O(O)—C—R, M-S(S)—C—R, M-O(O)—C—NH—R, M-S(S)—C—NH—R, M-O(O)—C—N—R, M-S(S)—C—N—R, M-O(O)—C—O—R, M-S(S)—C—O—R, M-O(O)—[C(O)O—C(O)O]n, and M-S(S)—[C(O)O—C(O)O]n;

in the precursor, R is an alkyl group having 1 to 20 carbon atoms, n is an integer of 1 to 10, and M comprises at least one selected from among Cd, Zn, Ir, Ga, Pd, Cu, Ag, Au, Rh, Ir, Ru, and Os; and the additive is a primary or secondary amine.

* * * * *